US011616598B2

(12) United States Patent
Xu et al.

(10) Patent No.: US 11,616,598 B2
(45) Date of Patent: Mar. 28, 2023

(54) PUNCTURING AND RETRANSMISSION TECHNIQUES FOR ENCODED TRANSMISSIONS

(71) Applicant: QUALCOMM Incorporated, San Diego, CA (US)

(72) Inventors: Changlong Xu, Beijing (CN); Jian Li, Beijing (CN); Joseph Binamira Soriaga, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/344,395

(22) PCT Filed: Jun. 22, 2017

(86) PCT No.: PCT/CN2017/089590
§ 371 (c)(1),
(2) Date: Apr. 24, 2019

(87) PCT Pub. No.: WO2018/076733
PCT Pub. Date: May 3, 2018

(65) Prior Publication Data
US 2020/0052819 A1  Feb. 13, 2020

(30) Foreign Application Priority Data
Oct. 26, 2016  (WO) ................ PCT/CN2016/103351

(51) Int. Cl.
*H04L 1/00* (2006.01)
*H04L 1/20* (2006.01)
(Continued)

(52) U.S. Cl.
CPC .......... *H04L 1/0069* (2013.01); *H04L 1/0057* (2013.01); *H04L 1/203* (2013.01); *H03M 13/6368* (2013.01); *H04L 1/1812* (2013.01)

(58) Field of Classification Search
CPC ..... H04L 1/0069; H04L 1/0057; H04L 1/203; H04L 1/1812; H04L 1/00; H04L 1/0068; H03M 13/6368; H03M 13/13
See application file for complete search history.

(56) References Cited

U.S. PATENT DOCUMENTS

| 2009/0227278 A1* | 9/2009 | Cho | H04L 1/0028 455/522 |
| 2009/0279633 A1* | 11/2009 | Lee | H04B 7/024 375/267 |
| 2010/0100787 A1* | 4/2010 | Zhang | H04L 1/1607 714/748 |

(Continued)

FOREIGN PATENT DOCUMENTS

| CN | 101237310 A | 8/2008 |
| CN | 105453466 A | 3/2016 |

(Continued)

OTHER PUBLICATIONS

NPL_ KR20160115803A_FAMILY: obtained from https://dialog.proquest.com/professional/docview/1843548153?accountid=131444 on Oct. 22, 2022 (Year: 2022).*
International Search Report and Written Opinion—PCT/CN2016/103351—ISA/EPO—dated Jul. 13, 2017.

(Continued)

*Primary Examiner* — Thinh D Tran
(74) *Attorney, Agent, or Firm* — Qualcomm Incorporated

(57) ABSTRACT

Various aspects of the disclosure relate to retransmission techniques for communication of information (e.g., for wireless communication). In some aspects, if a device's first transmission including punctured encoded data fails, the (Continued)

device's second transmission (e.g., in response to a NAK) may involve transmitting the punctured bits. In some aspects, the coding rate used for encoding the data for the first transmission is selected to meet an error rate (e.g., a block error rate) for the second transmission. The second transmission may also include at least some of the encoded data. In some aspects, the puncturing may be performed according to a puncture pattern that is generated based on bit error probabilities of bit positions for encoded data.

26 Claims, 27 Drawing Sheets

(51) Int. Cl.
     *H04L 1/1812*     (2023.01)
     *H03M 13/00*      (2006.01)

(56) References Cited

U.S. PATENT DOCUMENTS

| | | | |
|---|---|---|---|
| 2013/0223485 | A1 | 8/2013 | Bai et al. |
| 2016/0248547 | A1* | 8/2016 | Shen ................ H04L 1/0057 |
| 2016/0285479 | A1* | 9/2016 | El-Khamy ............ H03M 13/13 |
| 2017/0047947 | A1* | 2/2017 | Hong ................ H03M 13/2906 |
| 2019/0199480 | A1* | 6/2019 | Kim ................ H03M 13/6306 |

FOREIGN PATENT DOCUMENTS

| | | |
|---|---|---|
| CN | 105743621 A | 7/2016 |
| JP | 2001285261 A | 10/2001 |
| JP | 2005223620 A | 8/2005 |
| JP | 2007134888 A | 5/2007 |
| JP | 2011193434 A | 9/2011 |
| KR | 20090091768 A | 8/2009 |
| KR | 20160115803 A | 10/2016 |
| WO | 2008075627 A1 | 6/2008 |
| WO | 2010089835 A1 | 8/2010 |
| WO | 2018059023 A1 | 4/2018 |

OTHER PUBLICATIONS

International Search Report and Written Opinion—PCT/CN2017/089590—ISA/EPO—daed Sep. 25, 2017.

Nokia, et al., "Discussion on the IR-HARQ Support of Polar Codes", R1-1609586, 3GPP TSG-RAN WG1 #86bis Oct. 14, 2016 (Oct. 14, 2016), 2 Pages.
Chen K., et al., "A Hybrid ARQ Scheme based on Polar Codes", IEEE Communications Letters, IEEE Service Center, Piscataway, NJ, US, vol. 17, No. 10, Oct. 1, 2013 (Oct. 1, 2013), pp. 1996-1999, XP011535616, ISSN: 1089-7798, DOI: 10.1109/LCOMM.2013. 090213.131670 [retrieved on Oct. 28, 2013] the whole document.
Li B., et al., "Capacity-Achieving Rateless Polar Codes", Aug. 13, 2015 (Aug. 13, 2015), pp. 1-14, XP055449704, DOI: 10.1109/ISIT. 2016.7541258, Retrieved from the Internet: URL: https://arxiv.org/pdf/1508.03112.pdf. [retrieved on Feb. 9, 2018], Section 1, 2-4.2.5, the whole document.
Qualcomm Incorporated: "Polar Code Design Overview", 3GPP Draft, 3GPP TSG-RAN WG1 #85, R1-164699_POLAR_DESIGN_OVERVIEW, 3rd Generation Partnership Project (3GPP), Mobile Competence Centre, 650, Route Des Lucioles, F-06921 Sophia-Antipolis Cedex, France, vol. RAN WG1, No. Nanjing, China, May 23, 2016-May 27, 2016, May 14, 2016 (May 14, 2016), XP051089936, 3 Pages, Retrieved from the Internet: URL: http://www.3gpp.org/ftp/tsg_ran/WG1_RL1/TSGR1_85/Docs/ [retrieved on May 14, 2016] the whole document.
Qualcomm Incorporated: "Polar HARQ", 3GPP TSG-RAN WG1 #86, 3GPP Draft; R1-166371_Polar HARQ, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 22, 2016-Aug. 26, 2016, Aug. 21, 2016 (Aug. 21, 2016), 9 Pages, XP051140190, Retrieved from the Internet: URL: http://www.3gpp.org/ftp/Meetings_3GPP_SYNC/RAN1/Docs/ [retrieved on Aug. 21, 2016] the whole document.
Supplementary European Search Report—EP17864481—Search Authority—Munich—dated Jun. 3, 2020.
Samsung: "Discussions on UCI replication on MIMO PUSCH", 3GPP TSG RAN WG1 #62bisR1-105764, Xi'an, China, Oct. 11-15, 2010, URL: https://www.3gpp.org/ftp/tsg_ran/WG1_RL1/TSGR1_62b/Docs/R1-105764.zip, pp. 1-6.
Shimanuki N., et al., "Studies on Low Rate Concatenated Codes Based on Turbo-Like Codes", IEICE Technical Report, vol. 105, No. 666, Japan, The Institute of Electronics, Information and Communication Engineers, Mar. 10, 2006, vol. 105, pp. 165-170.
El-Khamy M., et al.,"HARQ Rate-Compatible Polar Codes for Wireless Channels", 2015 IEEE Global Communications Conference (GLOBECOM), Jan. 1, 2014 (Jan. 1, 2014), pp. 1-6, XP055397700, DOI: 10.1109/GLOCOM.2014.7417429, Section I and III, figures 4,5.

* cited by examiner

FIG. 17

PUNCTURING AND RETRANSMISSION TECHNIQUES FOR ENCODED TRANSMISSIONS

CROSS-REFERENCE TO RELATED APPLICATION(S)

This application is the U.S. national stage of PCT patent application number PCT/CN2017/089590 filed on Jun. 22, 2017 which claims priority to and benefit of PCT patent application number PCT/CN2016/103351 filed on Oct. 26, 2016, the content of each of which is incorporated herein by reference.

INTRODUCTION

Various aspects described herein relate to communication, and more particularly but not exclusively, to puncturing and retransmission techniques for encoded transmissions.

A wireless communication system may use error correcting codes to facilitate reliable transmission of digital messages over noisy channels. A block code is one type of error correcting code. In a typical block code, an information message or sequence is split up into blocks, and an encoder at the transmitting device mathematically adds redundancy to the information message. Exploitation of this redundancy in the encoded information message improves the reliability of the message, enabling correction for bit errors that may occur due to the noise. That is, a decoder at the receiving device can take advantage of the redundancy to reliably recover the information message even though bit errors may occur, in part, due to the addition of noise by the channel. Examples of error correcting block codes include Hamming codes, Bose-Chaudhuri-Hocquenghem (BCH) codes, and turbo codes among others. Many existing wireless communication networks utilize such block codes, such as 3GPP LTE networks, which utilize turbo codes, and IEEE 802.11n Wi-Fi networks.

To further improve communication performance (e.g., in wireless communication systems), a retransmission scheme such a hybrid automatic repeat request (HARQ) scheme may be used. In a HARQ scheme, coded blocks are retransmitted if the first transmission is not decoded correctly. In some cases, several retransmissions may be needed to achieve a desired level of communication performance Given the delay associated with multiple retransmissions, however, a HARQ scheme might not provide sufficiently robust performance for systems that have very strict latency and/or reliability requirements. Accordingly, there is a need for error correction techniques that can provide a high level of performance (e.g., for low latency applications and other robust applications).

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In one aspect, the disclosure provides an apparatus configured for communication that includes a memory and a processor coupled to the memory. The processor and the memory are configured to: encode a first block of data to generate encoded data comprising a plurality of bits; generate a puncture pattern based on bit error probabilities for bit positions associated with the plurality of bits; puncture a portion of the plurality of bits according to the puncture pattern to generate a second block of data; transmit first information comprising the second block of data; determine that another transmission is needed; and transmit second information comprising the portion of the plurality of bits, wherein the second information is transmitted as a result of the determination.

Another aspect of the disclosure provides a method for communication including: encoding a first block of data to generate encoded data comprising a plurality of bits; generating a puncture pattern based on bit error probabilities for bit positions associated with the plurality of bits; puncturing a portion of the plurality of bits according to the puncture pattern to generate a second block of data; transmitting first information comprising the second block of data; determining that another transmission is needed; and transmitting second information comprising the portion of the plurality of bits, wherein the second information is transmitted as a result of the determination.

Another aspect of the disclosure provides an apparatus configured for communication. The apparatus including: means for encoding a first block of data to generate encoded data comprising a plurality of bits; means for generating a puncture pattern based on bit error probabilities for bit positions associated with the plurality of bits; means for puncturing a portion of the plurality of bits according to the puncture pattern to generate a second block of data; means for transmitting first information comprising the second block of data; and means for determining that another transmission is needed, wherein the means for transmitting is configured to transmit second information comprising the portion of the plurality of bits, and wherein the second information is transmitted as a result of the determination.

Another aspect of the disclosure provides a non-transitory computer-readable medium storing computer-executable code, including code to: encode a first block of data to generate encoded data comprising a plurality of bits; generate a puncture pattern based on bit error probabilities for bit positions associated with the plurality of bits; puncture a portion of the plurality of bits according to the puncture pattern to generate a second block of data; transmit first information comprising the second block of data; determine that another transmission is needed; and transmit second information comprising the portion of the plurality of bits, wherein the second information is transmitted as a result of the determination.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

FIG. 17 is a diagram of an example of puncture patterns in accordance with some aspects of the disclosure.

DETAILED DESCRIPTION

Figure 1:
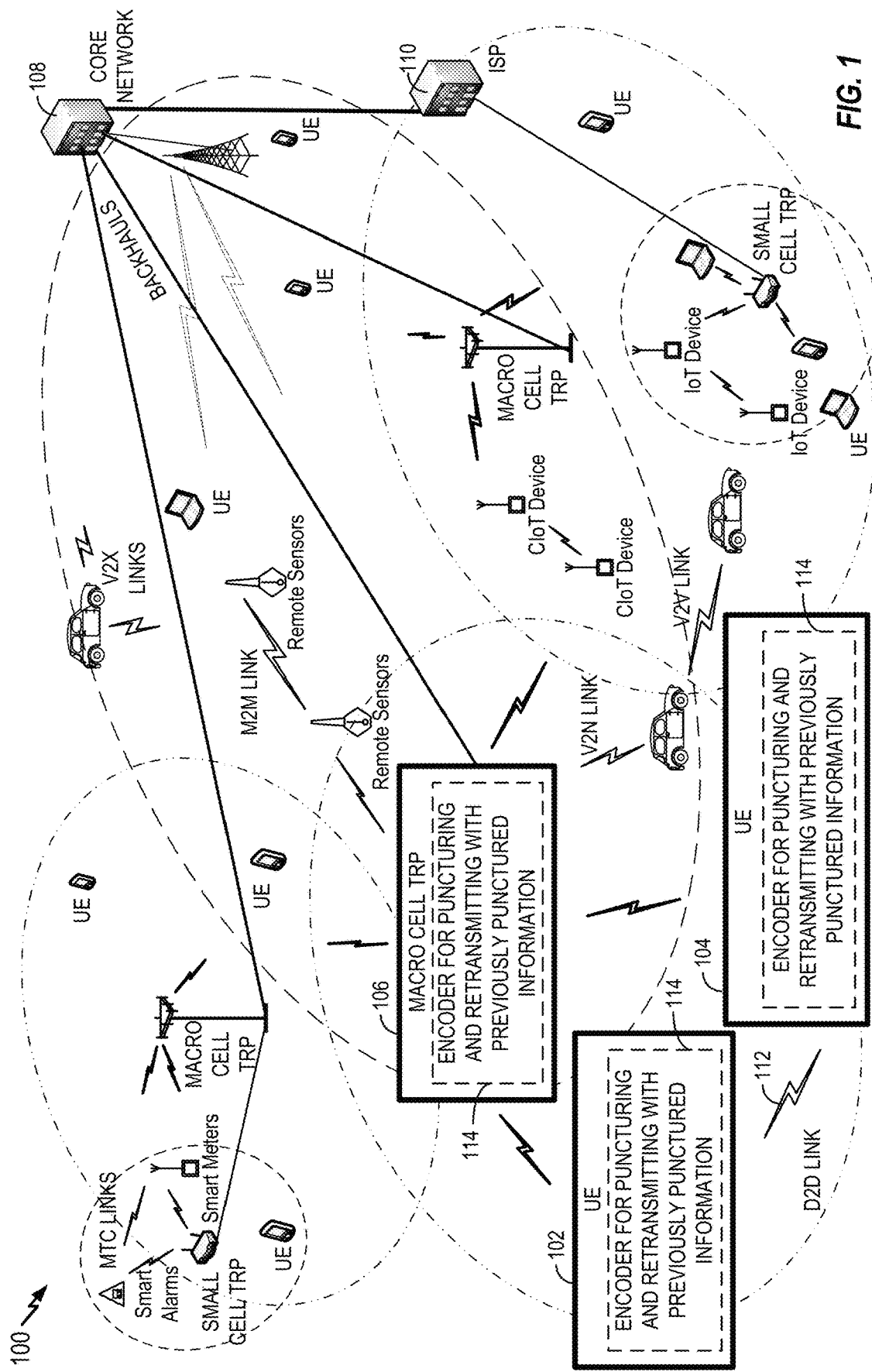
FIG. 1 is a block diagram of an example communication system in which aspects of the disclosure may be used.

Various aspects of the disclosure relate to retransmission of coded information. For example, the teachings herein may be used to provide hybrid automatic repeat request (HARQ) functionality for communication of information (e.g., for wireless communication). In some aspects, a device punctures encoded data to provide a first set of punctured encoded data (e.g., a mother code). The device then punctures the first set of punctured encoded data to provide a second set of punctured encoded data for a first transmission. In some aspects, the coding rate used for encoding the data for the first transmission is selected to meet an error rate (e.g., a block error rate) for a second transmission. If the device's first transmission fails (e.g., a NAK is received from a receiver), the device invokes a second transmission that involves transmitting the previously punctured encoded bits. The second transmission may also include at least some of the encoded data from the first set of punctured encoded data. In some aspects, the puncturing may be performed according to a puncture pattern that is generated based on bit error probabilities of bit positions for encoded data.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system and/or an LTE system. It should be appreciated, however, that the teachings herein may be used in other systems as well. Thus, references to functionality in the context of 5G and/or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, peer devices, and so on). In some implementations, one or more of the components of the system 100 may communicate with each other directedly via a device-to-device (D2D) link 112 or some other similar type of direct link.

Communication of information between two or more of the components of the system 100 may involve encoding the information. For example, the TRP 106 may encode data or control information that the TRP 106 sends to the UE 102 or the UE 104. As another example, the UE 102 may encode data or control information that the UE 102 sends to the TRP 106 or the UE 104. The encoding may involve block coding such as Polar coding. In accordance with the teachings herein, one or more of the UE 102, the UE 104, the TRP 106, or some other component of the system 100 may include an encoder for puncturing and retransmitting with previously punctured information 114.

The components and links of the wireless communication system 100 may take different forms in different implementations. Examples of UEs may include, without limitation, cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or include or be incorporated into) the functionality of a CIoT base station (C-BS), a NodeB, an evolved NodeB (eNodeB), radio access network (RAN) access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Figure 2:
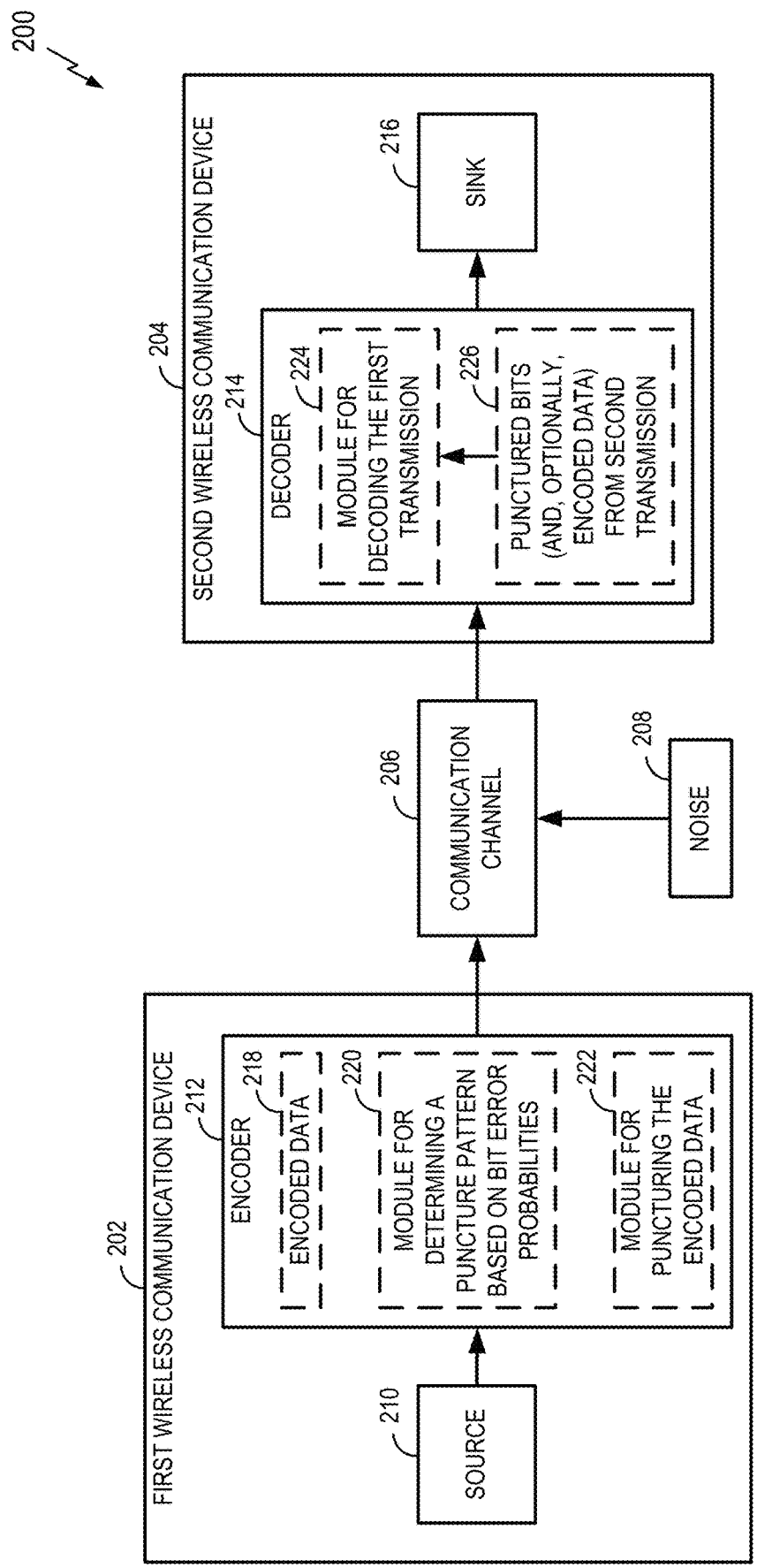
FIG. 2 is a block diagram of example communication devices in which aspects of the disclosure may be used.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links Network-to-device links may include, without limitation, uplinks (or reverse links), downlinks (or forward links), and vehicle-to-network (V2N) links Example Communication Components FIG. 2 is a schematic illustration of a wireless communication system 200 that includes a first wireless communication device 202 and a second wireless communication device 204 that may use the teachings herein. In some implementations, the first wireless communication device 202 or the second wireless communication device 204 may correspond to the UE 102, the UE 104, the TRP 106, or some other component of FIG. 1.

In the illustrated example, the first wireless communication device 202 transmits a message over a communication channel 206 (e.g., a wireless channel) to the second wireless communication device 204. One issue in such a scheme that should be addressed to provide for reliable communication of the message, is to take into account noise 208 that affects the communication channel 206.

Block codes or error correcting codes are frequently used to provide reliable transmission of messages over noisy channels. In a typical block code, an information message or sequence from an information source 210 at the first (transmitting) wireless communication device 202 is split up into blocks, each block having a length of K bits. An encoder 212 mathematically adds redundancy to the information message, resulting in codewords having a length of N, where N>K. Here, the code rate R is the ratio between the message length and the block length (i.e., R=K/N). Exploitation of this redundancy in the encoded information message is a key to reliably receiving the transmitted message at the second (receiving) wireless communication device 204, whereby the redundancy enables correction for bit errors that may occur due to the noise 208 imparted on the transmitted message. That is, a decoder 214 at the second (receiving) wireless communication device 204 can take advantage of the redundancy to reliably recover the information message provided to an information sink 216 even though bit errors may occur, in part, due to the addition of the 208 noise to the channel 206.

Many examples of such error correcting block codes are known to those of ordinary skill in the art, including Hamming codes, Bose-Chaudhuri-Hocquenghem (BCH) codes, and turbo codes, among others. Some existing wireless communication networks utilize such block codes. For example, 3GPP LTE networks may use turbo codes. However, for future networks, a new category of block codes, called Polar codes, presents a potential opportunity for reliable and efficient information transfer with improved performance relative to other codes.

Polar codes are linear block error correcting codes where channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise. This capacity can be achieved with a simple successive cancellation (SC) decoder.

The disclosure relates in some aspects, to the use of hybrid automatic repeat request (HARQ) with Polar codes. For example, the encoder 212 may generate encoded data 218 for a first transmission. The encoder 212 includes a module for determining a puncture pattern based on bit error probabilities 220 and module for puncturing the encoded data 222 using the determined puncture pattern. As used herein, the term puncturing may refer to, for example, reducing the size of a block by omitting (e.g., eliminating) some of the bits of the original block.

The first wireless communication device 202 sends a first transmission including the punctured encoded data to the second wireless communication device 204. In addition, the encoder 212 stores encoded information for a second transmission (e.g., the punctured portion of the encoded data that was not sent during the first transmission) in case a retransmission is needed.

At the second wireless communication device 204, the decoder 214 includes a module for decoding for the first transmission 224 (e.g., an SC decoder implemented in accordance with the teachings herein). If the decoder 214 is not able to correctly decode the received punctured encoded data of the first transmission, the second wireless communication device 204 may send NAK feedback (not shown) to the first wireless communication device 202.

In response to NAK feedback, the first wireless communication device 202 may send a second transmission (which may be referred to as a retransmission) including encoded data that was not sent in the first transmission (e.g., the punctured encoded data) to the second wireless communication device 204. In some cases, the second transmission may also include repetition information. The repetition information may include, for example, a repetition of the encoded data (e.g., at least a portion of the encoded data) that was sent in the first transmission.

The second wireless communication device 204 may thus obtain the punctured bits (and, optionally, encoded data) from the second transmission 226. In accordance with the teachings herein, the module for decoding for the first transmission 224 may use encoded bits received via the second transmission to decode the received data (of the first transmission). As mentioned above, this information includes data information that was not sent (e.g., was punctured) in the first transmission. In addition, this information may include, in some cases, a repetition of at least a portion of the encoded data from the first transmission. Thus, the decoding for the first transmission 224 may perform soft combining of the encoded data of the first transmission with the encoded data of the second transmission.

As discussed in more detail below, in some aspects, the disclosed HARQ scheme may be effective for ultra-reliability low latency communication (URLLC). A URLLC application may be used, for example, in a 5G system or some other type of communication system. URLLC may be used to support applications such as smart grid, industrial automation, augmented reality, and other high-performance applications. In some aspects, a URLLC application may have very strict performance requirements. For example, a block error rate (BLER) on the order of 1E-5 or even lower may be specified. In addition, latency on the order of 1 millisecond (ms) or lower may be specified.

Polar Codes

A brief introduction to Polar codes follows. Referring to the top of FIG. 3, a binary-input discrete memoryless channel 302 may be represented as W: X→Y, where X is an input and Y is an output of a channel W. The capacity C of this channel is: C=I(X;Y), where I represents the mutual information function.

Figure 3:
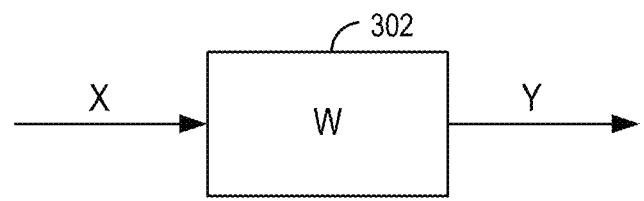
FIG. 3 is a diagram of an example representation of a communication channel.
Figure 3:
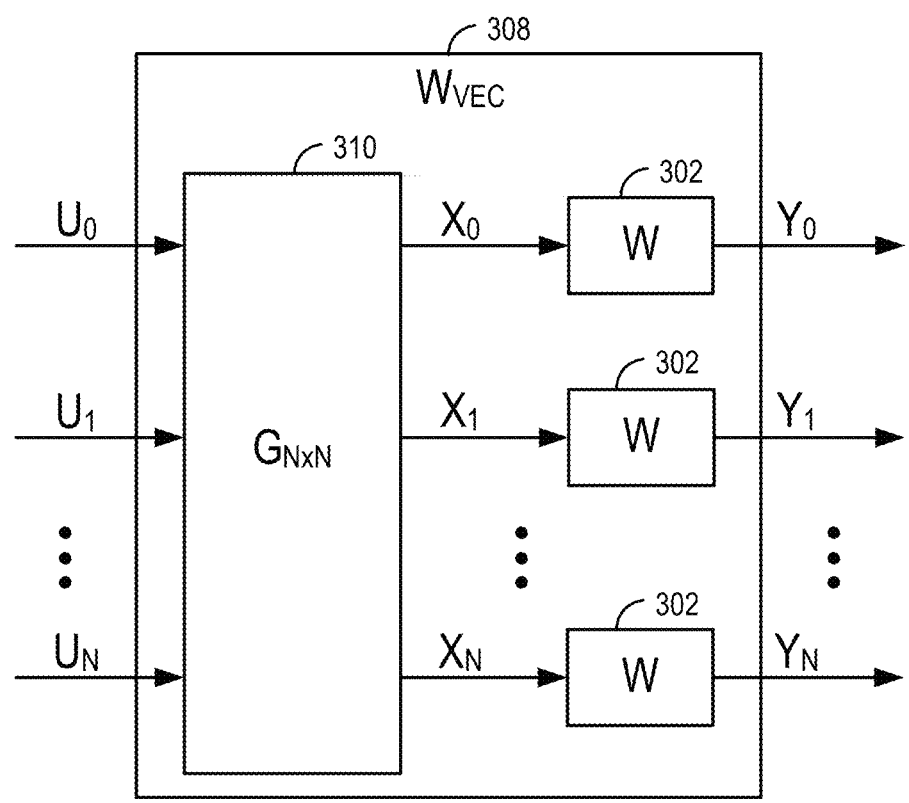

Referring to the bottom of FIG. 3, an effective channel $W_{VEC}$ 308 for multiple inputs may be represented as follows. For the example of a binary-input, $0 \leq C \leq 1$, a transformation may include the following operations. Starting with N copies of the channel W 302; a one-to-one mapping $G_{N \times N}$ 310 is applied from U inputs ($U_0, U_1, \ldots, U_N$) to X outputs ($X_0, X_1, \ldots, X_N$) as set forth in Equation 1 of Table 1. The effective channel $W_{VEC}$ 308 is thus created, with $X^N = U^N \cdot G_{N \times N}$. For the relatively simple case of N=2, $G_{N \times N}$ may be represented as set forth in Equation 2 of Table 1.

TABLE 1

| | |
|---|---|
| $X^N = U^N \cdot G_{N \times N}$, where $G_{N \times N} = \{0, 1\}^N \to \{0, 1\}^N$. | EQUATION 1 |
| $G_{2 \times 2} = \begin{bmatrix} 1 & 0 \\ 1 & 1 \end{bmatrix}$ | EQUATION 2 |
| $U_0 = X_0 \oplus X_1 = Y_{01} \oplus Y_1$ (corresponding to a parity-check) | EQUATION 3 |
| $U_1 = X_1 = X_0 \oplus U_0$ (corresponding to repetition) | |
| $\varepsilon^- = 1-(1-\varepsilon)^2 = 2\varepsilon-\varepsilon^2$ | EQUATION 4 |
| $\varepsilon^+ = \varepsilon^2$. | EQUATION 5 |

Figure 4:
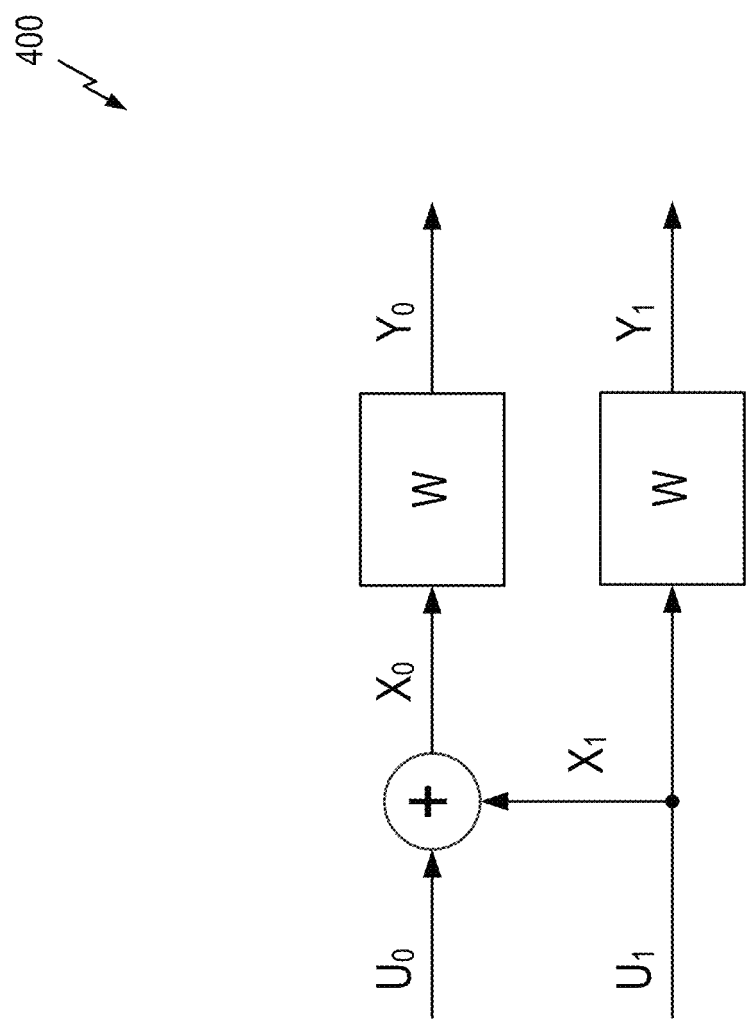
FIG. 4 is a diagram of an example of polarization for Polar codes.

Assuming W is a binary erasure channel (BEC) with an erasure probability 'ε', the relationships set forth in Equation 3 of Table 1 are true (with reference to the schematic 400 of FIG. 4). In FIG. 4, $U_0$ is an input and $Y_0$ is an output for a channel $W_0$. Similarly, $U_1$ is an input and $Y_1$ is an output for a channel $W_1$.

For the channel $W_0:U_0 \to Y^N$, the erasure probability ($\varepsilon^-$) is set forth in Equation 4 of Table 1. For the channel $W_1:U_1 \to (Y^N, U_0)$, the erasure probability ($\varepsilon^+$) is set forth in Equation 5 of Table 1. In view of the above, $W_1$ is a better channel than $W_0$. Accordingly, $U_1$ will have a higher reliability than $U_0$. The above operation can be performed recursively, yielding more polarization across N.

Polar Code Encoder Structure

Figure 5:
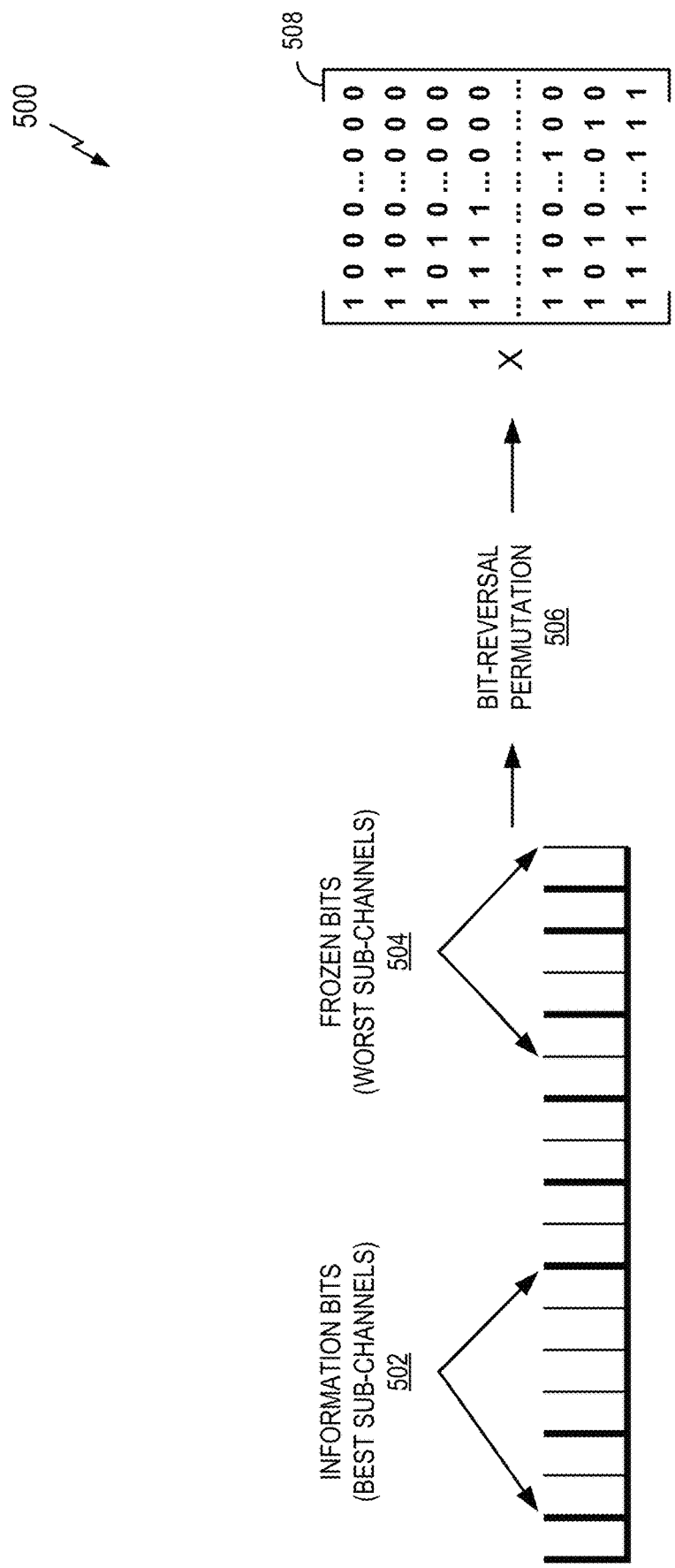
FIG. 5 is a diagram of an example structure of an encoder based on Polar codes.

An example of an encoder structure 500 for Polar codes is depicted in FIG. 5. As discussed above, the quality of different Polar code sub-channels may be quite different. In some implementations, the sub-channels correspond to the bit channels between the input of the encoder in the transmitter and the output of a successive cancellation (SC) decoder in the receiver.

In the example, of FIG. 5, the Polar code sub-channels are allocated into subsets, ranging from the best sub-channels to the worst sub-channels, based on the corresponding error probability associated with each sub-channel as discussed in the previous section. In this example, the information bits 502 are put on the best sub-channels while frozen bits 504 (with zero values) are put on the worst sub-channels. A bit-reversal permutation 506 is used to provide the output bits of the decoder in a desired sequence. The encoding is performed after multiplying by a Hadamard matrix 508. The generator matrices of Polar codes are comprised of the rows of a Hadamard matrix. The rows corresponding to low error probabilities of an SC decoder are selected for information bits while the remaining rows are for frozen bits.

It may thus be seen that the Polar codes are one type of block codes (N, K), where N is the code block size (codeword length) and K is the number of information bits. With polar codes, the codeword length N is a power-of-two (e.g., 256, 512, 1024, etc.) because the original construction of a polarizing matrix is based on the Kronecker product of $$\begin{bmatrix} 1 & 0 \\ 1 & 1 \end{bmatrix}.$$

HARQ Example

HARQ incremental redundancy (HARQ-IR) schemes are widely used in wireless communication systems to improve transmission efficiency. In a HARQ-IR scheme, the coded blocks will be retransmitted if the first transmission is not decoded correctly. The maximum number of transmissions in a typical application is four. However, some applications may use a different retransmission limit.

Figure 6:
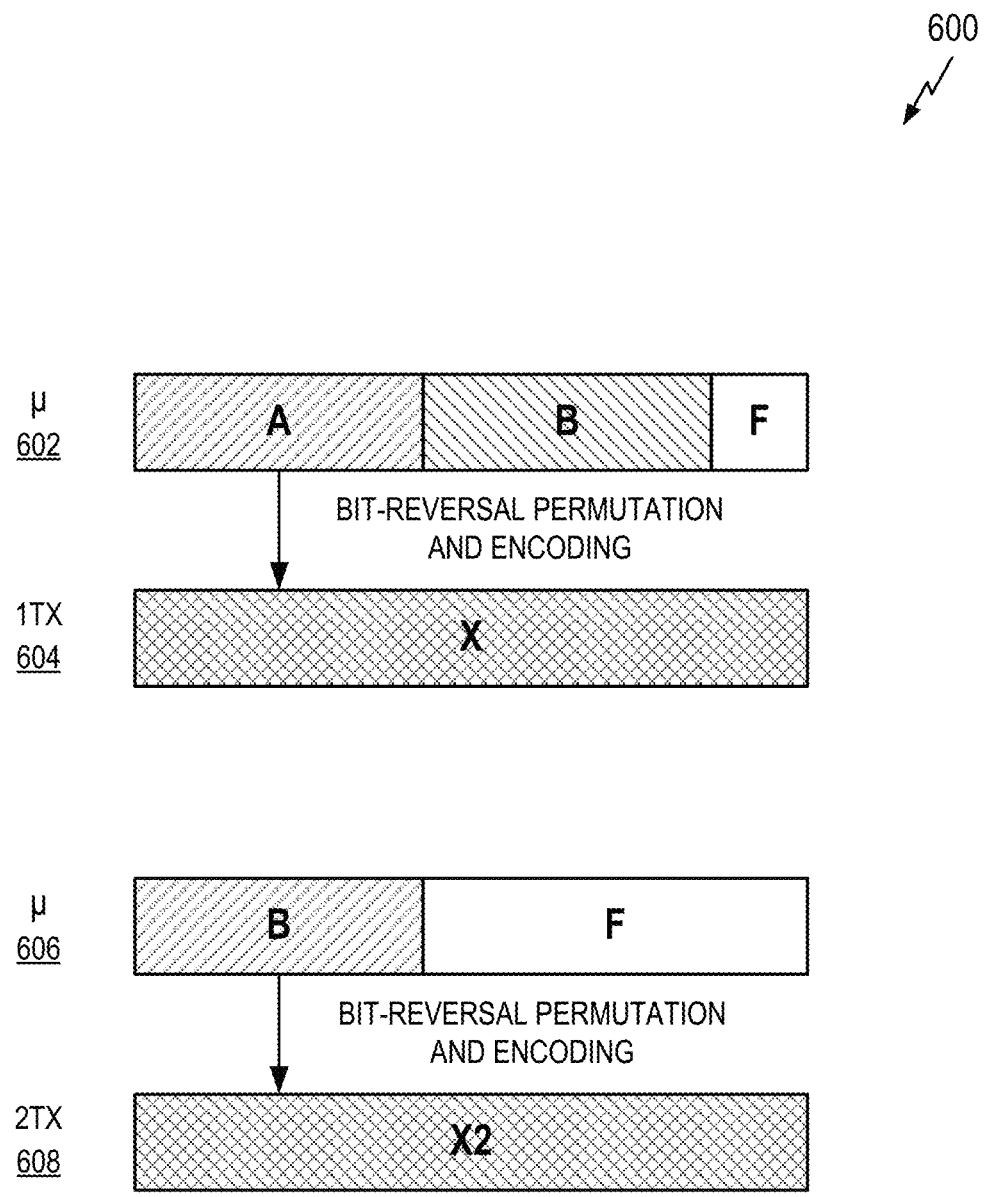
FIG. 6 is a diagram of an example HARQ technique for Polar codes.

An example of a HARQ-IR scheme 600 for Polar codes is depicted in FIG. 6. For simplification, only a first transmission and a second transmission (a retransmission) are shown. In the μ domain 602 of the first transmission, the information bits are allocated into two sub-blocks denoted as A and B. The F block is for frozen bits with a value of zero. After bit-reversal permutation and encoding, a coded block in the X domain is obtained. If the first transmission (1TX) 604 of this block is decoded correctly at the receiver, the transmission ends.

However, if the first transmission (1TX) 604 is not decoded correctly, the transmitter will generate a new codeword in the μ domain 606 with B information bits. After bit-reversal permutation and encoding, the transmitter invokes a second transmission (2TX) 608 to send a corresponding coded block in the X2 domain. If the receiver does not decode the B information for the second transmission (2TX) 608 correctly, a third transmission may be invoked, and so on.

If the B information in the second transmission (2TX) 608 is decoded correctly by the receiver, the B information in first transmission will be set as frozen bits and the A information in first transmission will be decoded accordingly. In this case, this is equivalent to obtaining the low rate for the A information in the first transmission.

From a performance standpoint, the algorithm of FIG. 6 may thus be equivalent to existing (e.g., non-Polar coding) HARQ-IR schemes in terms of coding gain. In FIG. 6, the equivalent coding rate after two transmissions is half of the first transmission with a block size of the first transmission. As such, the performance may be worse than the performance would be using half-rate coding with double the block size of the first transmission. Moreover, the algorithm of FIG. 6 involves two separate coding processes: one for the first transmission and another one for the second transmission.

In the algorithm of FIG. 6, the equivalent coding rate after two transmissions is reduced to half of the first transmission by setting the information bits of the second transmission as frozen bits. This implies that the coding gain is not obtained as a conventional HARQ-IR scheme for turbo codes and low-density parity check (LDPC) codes. In addition, the performance may become worse under a fading channel because there is no diversity gain from multiple transmissions.

In view of the above, existing algorithms may be difficult to apply in URLLC. In a URLLC system, the maximum number of transmissions may be relatively low to meet low latency requirements. For example, the maximum number of transmissions may be limited to two (or some other number), with the requirement that the desired block error rate (BLER) still be met with this small number of transmissions. Existing schemes might not be able to meet the desired BLER within the maximum allowed number of transmissions. Consequently, existing HARQ schemes might not be efficient enough for URLLC given the ultra-reliability and low latency requirements in URLLC applications.

Low Latency and Ultra-Reliability HARQ Scheme for Polar Codes

The disclosure relates in some aspects to efficient incremental redundancy HARQ for Polar codes. An example of design objectives for HARQ for Polar codes that can provide low latency and ultra-reliability (e.g., sufficient for URLLC applications) in accordance with the teachings herein follows. First, the target BLER of the final transmission may be guaranteed. For example, the disclosed techniques may provide a guaranteed BLER for the second transmission with robust performance under a fading channel. Second, a suitable coding rate for the first transmission may be selected to increase efficiency. Third, more resources may be allocated for the final transmission to provide an ultra-low residual BLER. For example, to get better performance, the target BLER for the first transmission may be different from the target BLER for the second transmission. In addition, more coded bits may be transmitted if the channel is worse than expected.

Example HARQ Operations

Figure 7:
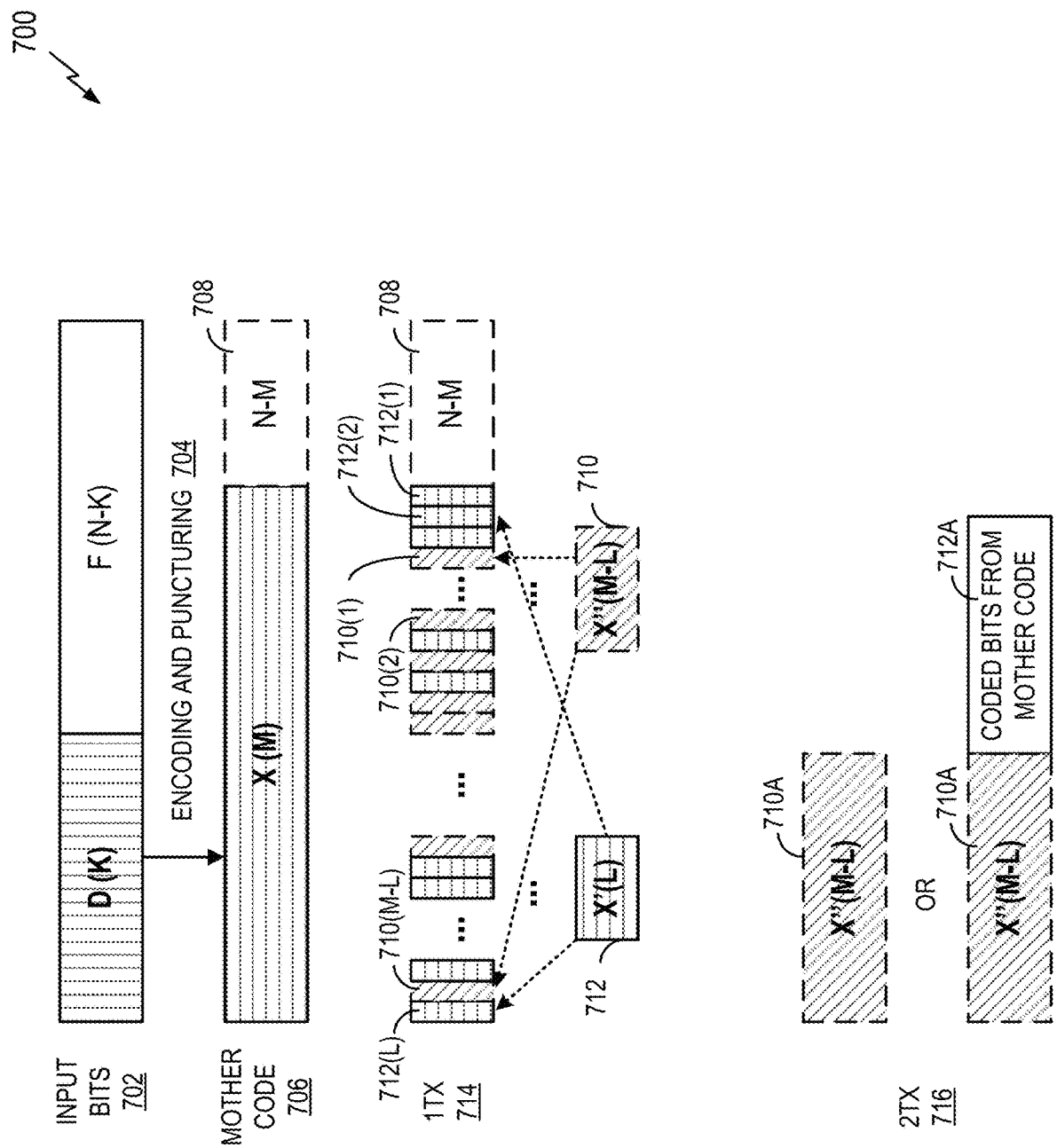
FIG. 7 is a diagram of an example puncturing and retransmission technique in accordance with some aspects of the disclosure.

FIG. 7 depicts example HARQ operations 700 for Polar codes that may be used to meet the above design objectives. The input for the HARQ operations 700 consists of input bits 702 including a block D of length K bits for data and a block F of length N-K for frozen bits (each with a value of 0). The block D in FIG. 7 generally corresponds to the A and B blocks of FIG. 6.

The HARQ operations 700 will be described in conjunction with the process 800 of FIG. 8. The process 800 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 800 may be implemented by any suitable apparatus capable of supporting communication-related operations.

At block 802, an apparatus (e.g., a device that includes an encoder) encodes input bits to generate a Polar codeword. At block 804, the apparatus generates a so-called mother code by puncturing the Polar codeword using a first puncture pattern. The number of bits punctured is based on the selected coding rate.

These operations are represented by the encoding and puncturing 704 of FIG. 7. In this example, the desired mother code 706 is Polar code (M, K). The original code (N, K), i.e., the input bits 702 having a length N and including K information bits, is encoded and the positions for information bits is determined using the algorithm described below. The mother code 706 (Polar code (M, K)) is obtained by puncturing N-M coded bits 708 according to a puncture pattern $P_{N-M}$ (discussed below).

At block 806 of FIG. 8, the apparatus punctures the mother code using a second puncture pattern (based on puncture patterns $P_{N-M}$ and $P_{M-L}$, discussed below) to provide a block of data for a first transmission. As shown in FIG. 7, M-L bits 710, designated X"(M-L), of the encoded bits X(M) of the mother code 706 are punctured leaving coded bits 712, designated X'(L), for the first transmission (1TX) 714. That is, the bits 710(1), 710(2), through 710(M-L) will be punctured (along with the previously punctured bits 708), leaving encoded bits 712(1), 712(2), through 712(L) for the first transmission 714.

Figure 8:
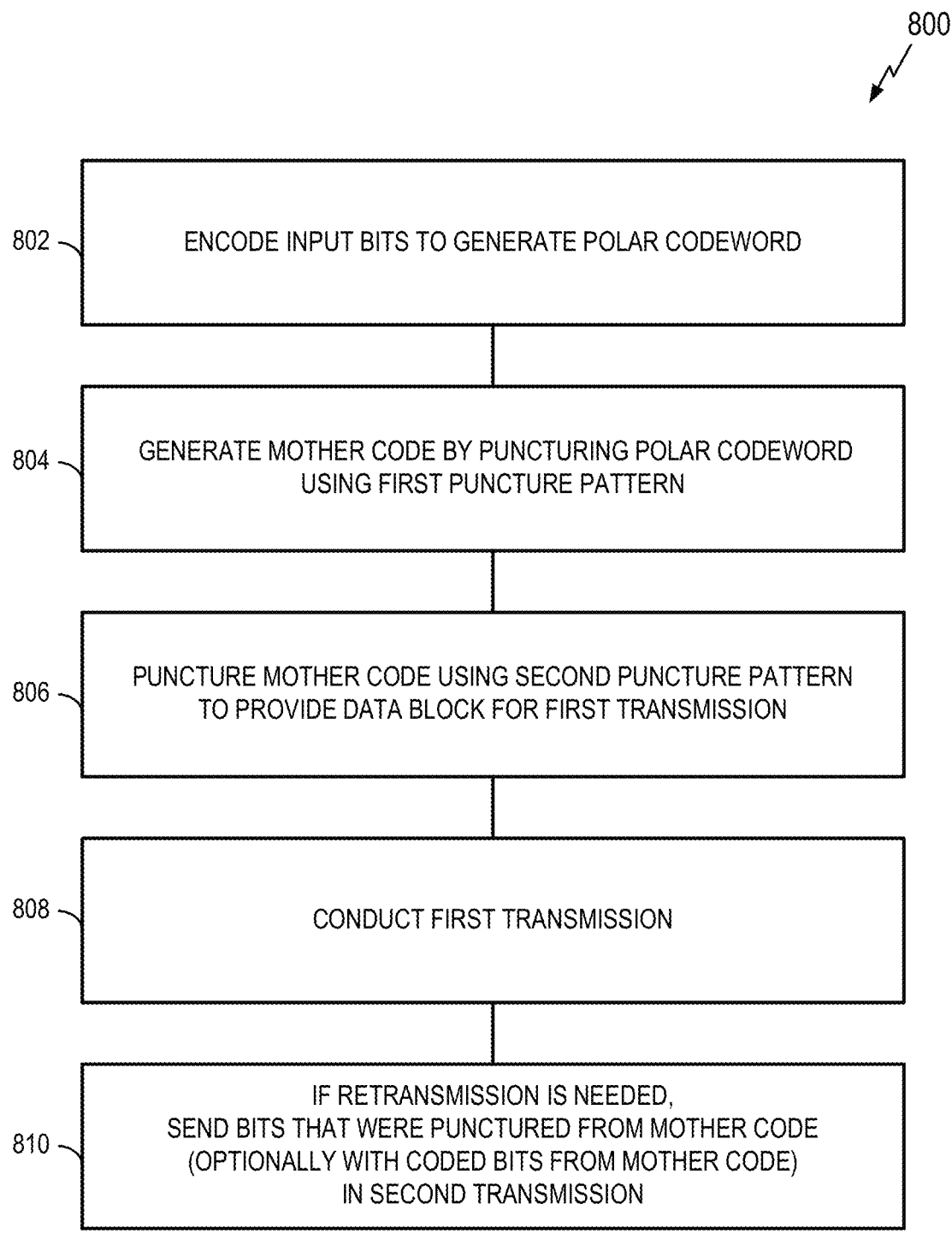
FIG. 8 is a flowchart illustrating an example of a HARQ process in accordance with some aspects of the disclosure.

At block 808 of FIG. 8, the apparatus conducts the first transmission. Thus, the bits 712(1) through 712(L) are transmitted during the first transmission 714 if FIG. 7.

As discussed herein, in some cases, a retransmission may be needed. For example, the apparatus may receive an indication (e.g., a NAK) that the receiving apparatus was not able to successfully decode the first transmission. One or more retransmissions may be allowed depending on application requirements.

At block 810, if retransmission is needed, the apparatus sends bits that were punctured from the mother code at block 806. In addition, in some cases, at least some of the coded bits from the mother code (i.e., bits that were sent during the first transmission at block 808) may be sent as well. Thus, in FIG. 7, the second transmission (2TX) 716 includes M-L coded bits 710A (corresponding to the X"(M-L) bits 710). In addition, in some cases, at least some of the coded bits from the mother code 712A (i.e., at least one of code bits that was sent during the first transmission 714) may be retransmitted during the transmission 716.

Example Encoding Operation

Figure 9:
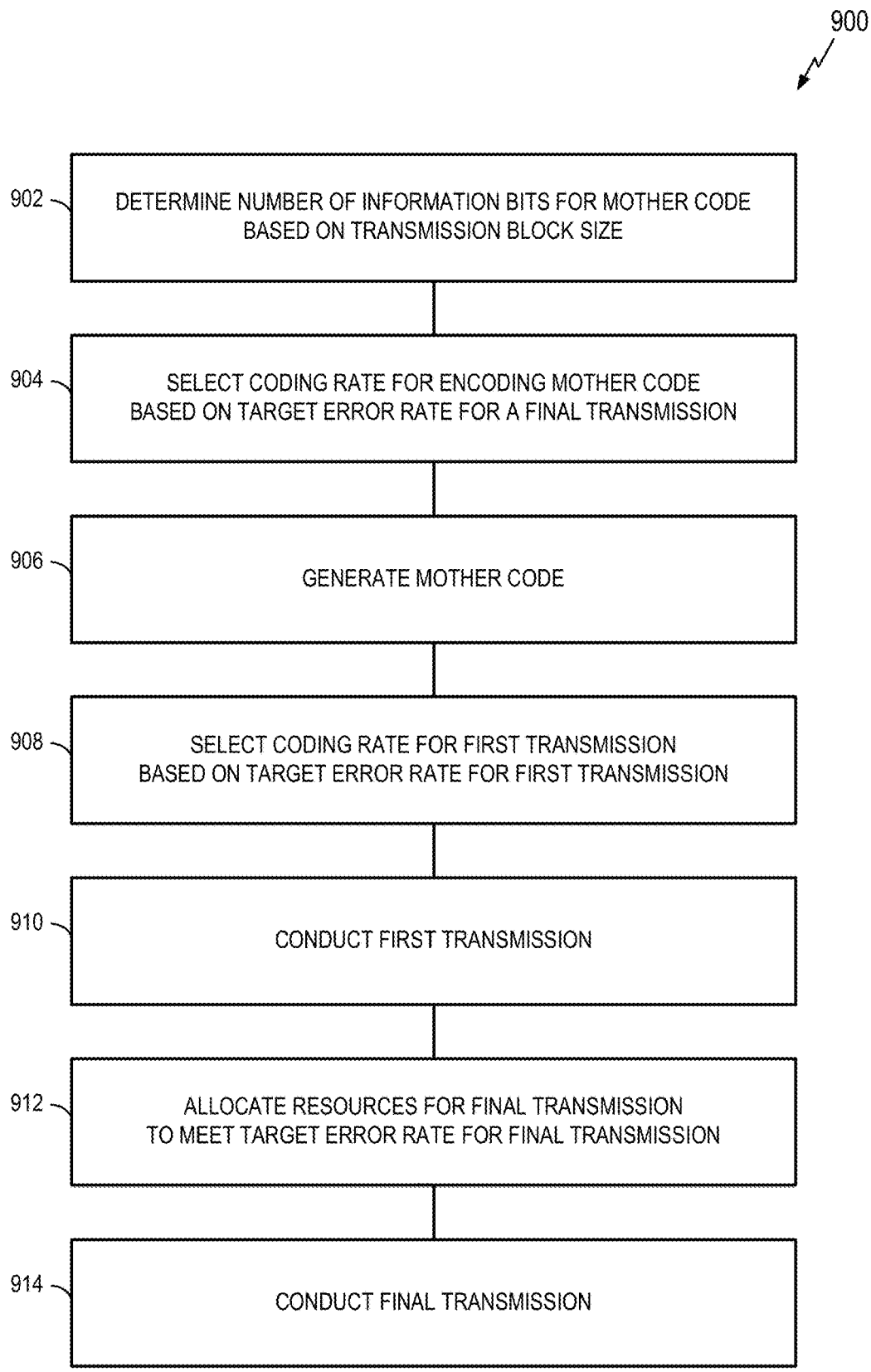
FIG. 9 is a flowchart illustrating another example of a HARQ process in accordance with some aspects of the disclosure.

As mentioned above, a HARQ process in accordance with the teachings herein may be designed to meet certain BLER objectives with respect to the first transmission and the second transmission (or a final transmission). FIG. 9 illustrates an example of such a process 900. The process 900 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 900 may be implemented by any suitable apparatus capable of supporting communication-related operations.

At block 902, an apparatus (e.g., a device that includes an encoder) determines the number of information bits for the mother code (e.g., the size of the mother code). In some aspects, this number may be based on the transmission block size.

At block 904, the apparatus selects a coding rate for encoding a mother code. In some aspects, this coding rate may be selected based on a target error rate for a final transmission (e.g., a target BLER for a second transmission). As discussed herein, the target error rate may be based on conditions (e.g., the target long-term SNR) of a channel.

At block 906, the apparatus generates the mother code. For example, the apparatus may encode input data according to the coding rate selected at block 902. As discussed herein, this encoding may be Polar coding.

At block 908, the apparatus selects a coding rate for a first transmission. In some aspects, this coding rate may be selected based on a target error rate (e.g., a target BLER) for the first transmission. For example, the mother code may be encoded (with puncturing) according to the coding rate to generate a block of data to be transmitted.

At block 910, the apparatus conducts the first transmission. For example, the apparatus may send the encoded block of data to a receiving apparatus via a wired or wireless communication medium.

As discussed herein, in some cases, a retransmission may occur. For example, the apparatus may receive an indication (e.g., a NAK) that the receiving apparatus was not able to successfully decode the first transmission. One or more retransmissions may be allowed depending on application requirements.

At block 912, if needed, the apparatus allocates resources for the final transmission to meet the target error rate (e.g., a target BLER) for the last transmission.

At block 914, the apparatus conducts the final transmission using the resources allocated at block 912.

Generating the Mother Code

Figure 10:
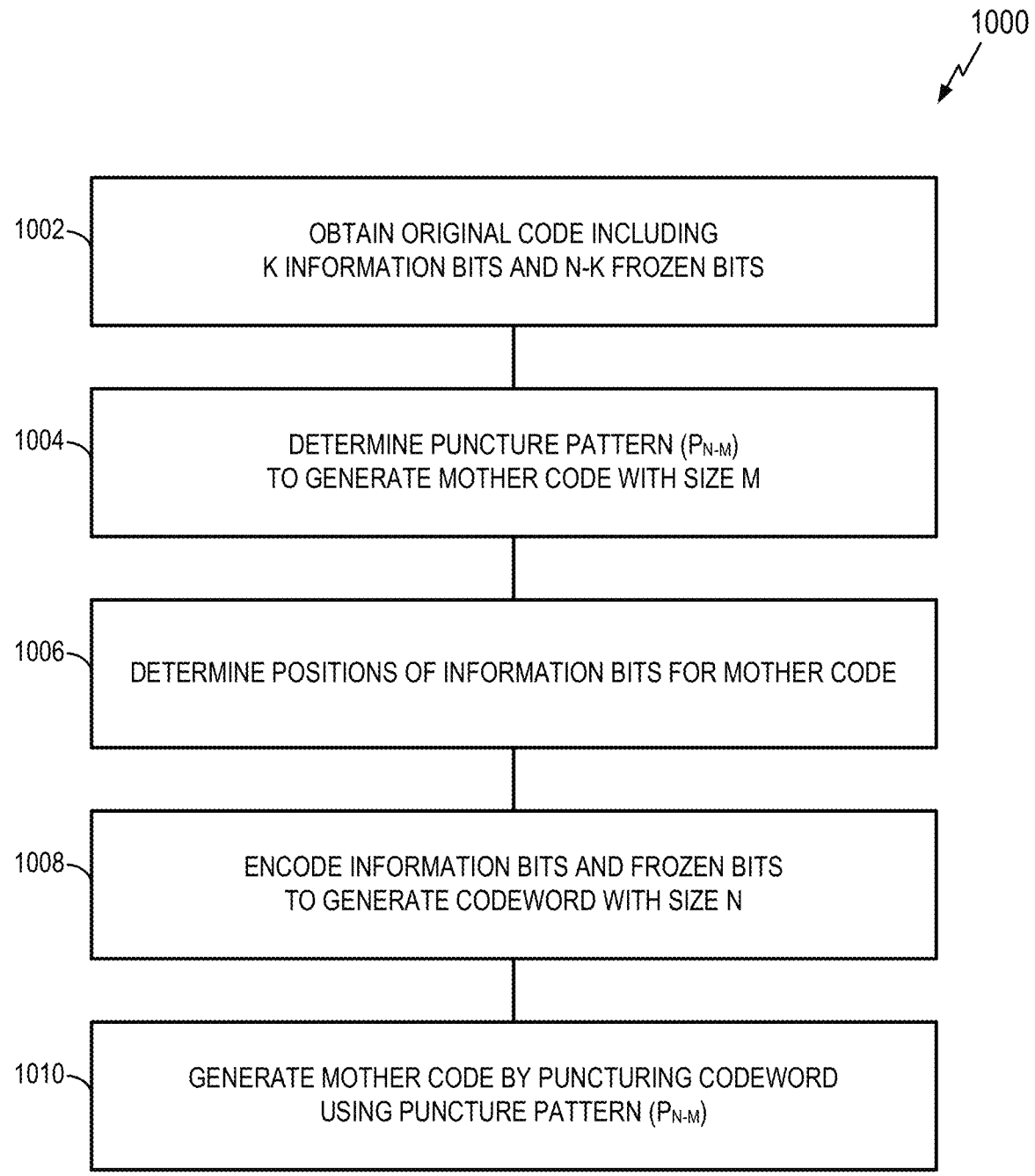
FIG. 10 is a flowchart illustrating an example of a process for generating a mother code in accordance with some aspects of the disclosure.

FIG. 10 illustrates an example of a process 1000 for generating a mother code. The process 1000 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1000 may be implemented by any suitable apparatus capable of supporting communication-related operations.

At block 1002, an apparatus (e.g., a device that includes an encoder) obtains the original code including K information bits and N-K frozen bits.

At block 1004, the apparatus determines a puncture pattern $P_{N-M}$ to be used to generate a mother code with size M. The generation of this puncture pattern is discussed in more detail below in conjunction with FIG. 13.

As mentioned above, the number of the information bits of the mother code may be based on the transport block size. Thus, the size of the mother code may depend on the size of a protocol data unit (PDU) specified by an upper protocol layer. In some aspects, the upper layer may set the transport block size based on the type of data being transmitted, system requirements, or other factors.

In general, the transport block size in URLLC may be relatively small. Therefore, in this case, the transport block can be encoded into one code block to avoid high latency.

In view of the above, in some aspects, the size of D in FIG. 7 may depend on the transport block size. In one non-exclusive example, the block size for the first transmission 714 of FIG. 7 is the same as the block size of FIG. 6 (e.g., with D being the same as well). Thus, the block size for the mother code 706 of FIG. 7 is larger than the block size of FIG. 6, thereby enabling better performance.

At block 1006, in conjunction with the encoding of block 1008 (below), the apparatus determines the positions for the information bits in the mother code. In some aspects, this operation may correspond to a decoding operation that may performed at a receiver. The determination of these bit positions is discussed in more detail below in conjunction with FIGS. 13 and 14.

At block 1008, the apparatus encodes the information bits and the frozen bits to generate a codeword with size (e.g., length) N. The modulation order and coding rate for generating the mother code may be selected to achieve the target BLER for the second transmission according to a long-term signal-to-noise ratio (SNR). The long-term SNR may be obtained, for example, by averaging the SNR of data received via a channel over a period of time.

At block 1010, the apparatus completes the generation of the mother code by puncturing N-M coded bits from the original Polar code (N, K) according to the puncture pattern $P_{N-M}$.

Generating Code for the First Transmission

Figure 11:
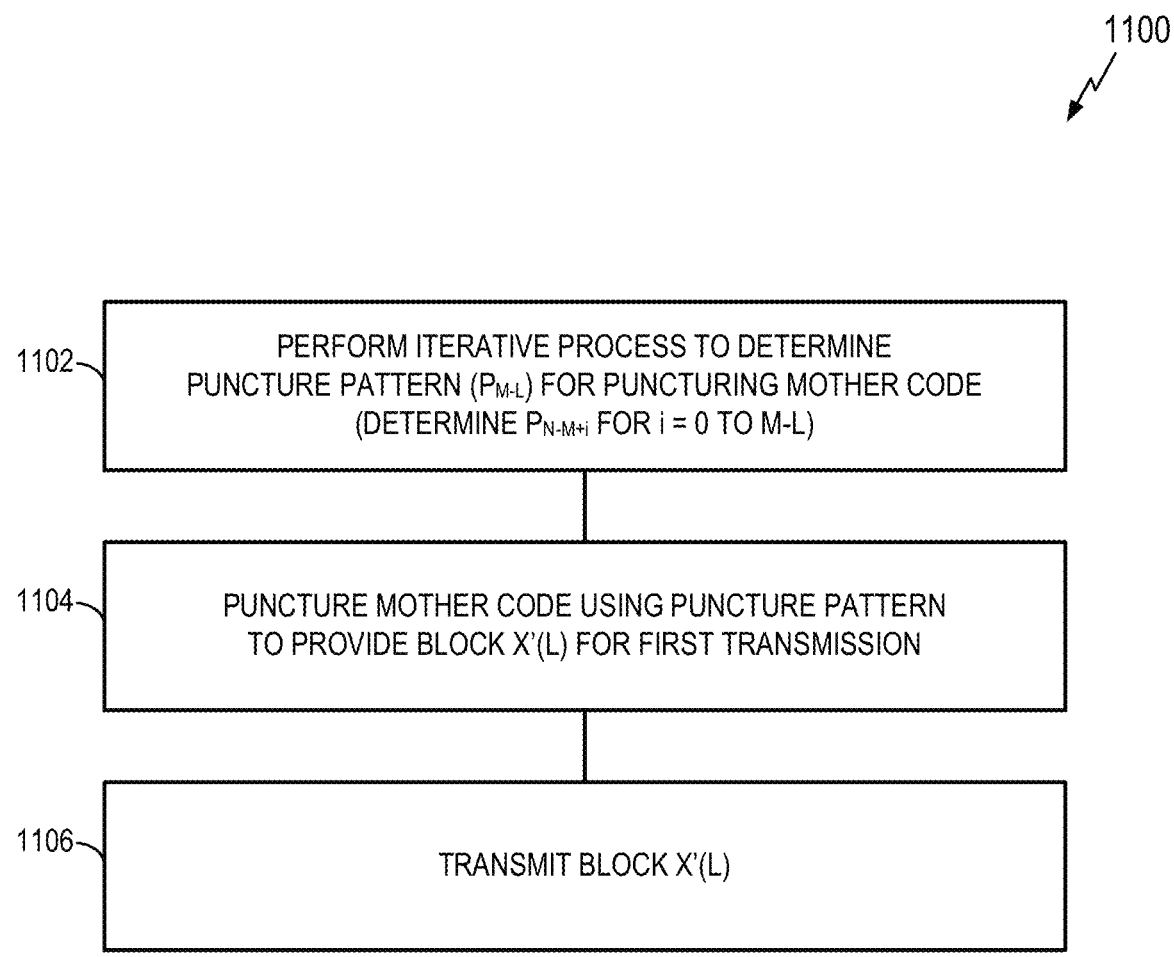
FIG. 11 is a flowchart illustrating an example of a process for conducting a first transmission in accordance with some aspects of the disclosure.

FIG. 11 illustrates an example of a process 1100 for generating code for the first transmission from the mother code. The process 1100 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1100 may be implemented by any suitable apparatus capable of supporting communication-related operations.

At block 1102, an apparatus (e.g., a device that includes an encoder) performs an iterative process to determine a puncture pattern $P_{M-L}$ for puncturing the mother code. As discussed in more detail below in conjunction with FIGS. 15-17, the iterative process involves determining $P_{N-M+i}$ for i=0 to i=M-L. In some aspects, the number of puncture bits may be based on the target BLER for the first transmission.

At block 1104, the apparatus punctures the mother code using the puncture pattern determined at block 1102. This puncturing provides the block X' (L) for the first transmission (e.g., the coded bits 712 of FIG. 7).

At block 1106, the apparatus transmits the block X'(L).

Generating Code for the Second Transmission

If the code in the first transmission is not decoded correctly, the receiver may feedback a NAK signal to the transmitter. In response, the transmitter will generate coded bits for a second (or last) transmission. The coding rate for the second transmission may be determined based on channel quality (e.g., based on CQI feedback). If this coding rate is not less than the coding rate for the first transmission, the second transmission will consist of the M-L punctured bits X″ of the first transmission. Sending all of the punctured bits helps to ensure that the desired performance for the second transmission is met. If the determined coding rate for the second transmission is less than the coding rate of the first transmission, additional coded bits of the mother code will be transmitted to meet the target BLER for the second transmission. If the additional coded bits are needed, the bits may be selected according to the best performance for the second transmission.

From the above, it should be appreciated that the BLER of the second transmission may be lower than that of existing algorithms because of the use of a larger block size when generating the mother code. Moreover, the disclosed algorithm can provide good throughput in terms of guaranteeing the target BLER of the second transmission. Also, the second transmission does not involve a separate Polar coding operation in contrast with the example of FIG. 6.

Figure 12:
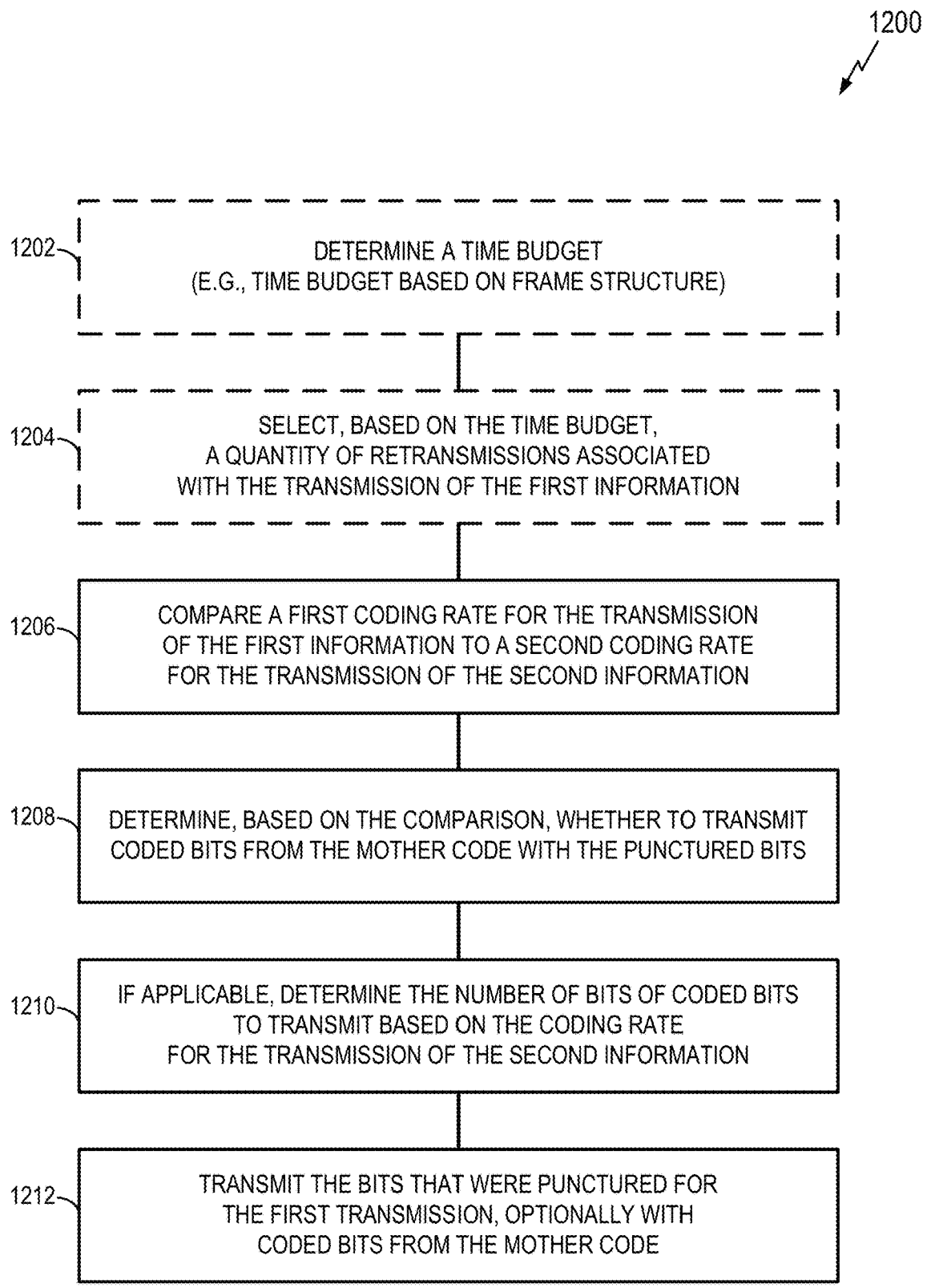
FIG. 12 is a flowchart illustrating an example of a retransmission process in accordance with some aspects of the disclosure.

FIG. 12 illustrates an example of a process 1200 for generating code for the first transmission from the mother code. The process 1200 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1200 may be implemented by any suitable apparatus capable of supporting communication-related operations.

Optional blocks 1202 and 1204 involve determining the maximum number of retransmissions that are supported. The number of retransmissions that are used in a given scenario may be based on operating requirements. In some aspects, the maximum number of transmissions may be limited by the frame structure. For example, in a time division duplex (TDD) system, a fixed amount of time is allocated for transmission in one direction (e.g., uplink) before a turn-around (e.g., to downlink) is required. Thus, in some cases, all retransmissions may need to complete before the turn-around occurs. Thus, a retransmission time budget can depend on the frame structure in some cases. Alternatively, or in addition, the retransmission time budget may be based on some other factor or other factors.

At optional block 1202, an apparatus (e.g., a device that includes an encoder) may determine a time budget. For example, the apparatus may calculate the time budget based on the frame structure to be used for a HARQ process.

At optional block 1204, the apparatus may select, based on the time budget, a quantity of retransmissions associated with the transmission of the first information. For example, the apparatus may determine the maximum number of retransmissions by dividing the time budget by the duration of a retransmission (e.g., the maximum amount of time that a retransmission would take).

Blocks 1206-1210 involve determining whether to send additional coded bits with the second (or last) transmission. In this case, the determination is based on the coding rates for the first and second transmissions.

At block 1206, the apparatus compares a first coding rate for the transmission of the first information to a second coding rate for the transmission of the second information.

At block 1208, the apparatus determines, based on the comparison, whether to transmit coded bits from the mother code with the punctured bits. For example, the apparatus may transmit the repetition information if the second coding rate is less than the first coding rate.

At block 1210, if the determination of block 1208 is to transmit the coded bits, the apparatus determines a quantity of coded bits to send based on a coding rate for the transmission of the second information. For example, additional coded bits may be sent if the coding rate allows for the additional bits.

At block 1212, the apparatus transmits the bits that were punctured for the first transmission. In addition, the apparatus may transmit the coded bits from the mother code depending on the determination of block 1208.

Puncture Pattern Generation

As discussed above, coded bits for each transmission are obtained by puncturing some of the code bits from the mother code according to a puncture pattern. In some aspects, the puncture pattern may be specified to obtain better performance.

The original coded block size for Polar codes is a power of 2. The mother code may be obtained by puncturing the original coded block if the original block size is not power of 2. As discussed above, another puncturing operation is used to generate the coded bits for each transmission by puncturing some bits from the mother codes. Techniques for generating a unified puncture pattern for both of these puncturing operations will now be discussed.

The following presents an example where the desired mother Polar code is (M, K) with M and L for block size and K for number of information bits. The length of the coded bits for the first transmission is L. N is the smallest integer power of 2 that is larger than M. The mother Polar code (M, K) can be obtained by puncturing N-M coded bits from the original Polar code (N, K) and the coded bits for first transmission may be obtained by further puncturing another M-L coded bits from the mother code. The final puncture pattern can be obtained by the following Steps 1, 2, and 3.

Step 1—Generate the Puncture Pattern for the Mother Code

The puncture pattern can be expressed as $P_{N-M}=(1, 1, \ldots, 1, 0, \ldots 0)_N$ consisting of M continuous ones following by N-M continuous zeros. A value of 0 in the puncture pattern means that the coded bit in the corresponding location will be punctured.

Step 2—Determine the Positions of Information Bits in the Mother Code

The positions of the information bits in the mother code can be determined using the puncture pattern defined in the Step 1. Initially, a suitable signal to noise ratio (SNR) for Gaussian Approximation (GA), Density Evolution (DE) algorithm, or some other similar algorithm is selected. The construct SNR becomes larger with an increase of the coding rate. In one implementation, the selected construct SNR is $S_{initial}$ dB with a noise variance value $\delta^2$. The positions of the information bits can be obtained following the procedure shown in FIG. 13 as further described in FIG. 14.

The positions for information bits are the positions denoted by "D". The positions for the information bits can remain the same (i.e., need not be not changed) in each transmission. This is in contrast with the HARQ-IR scheme of FIG. 6.

Figure 14:
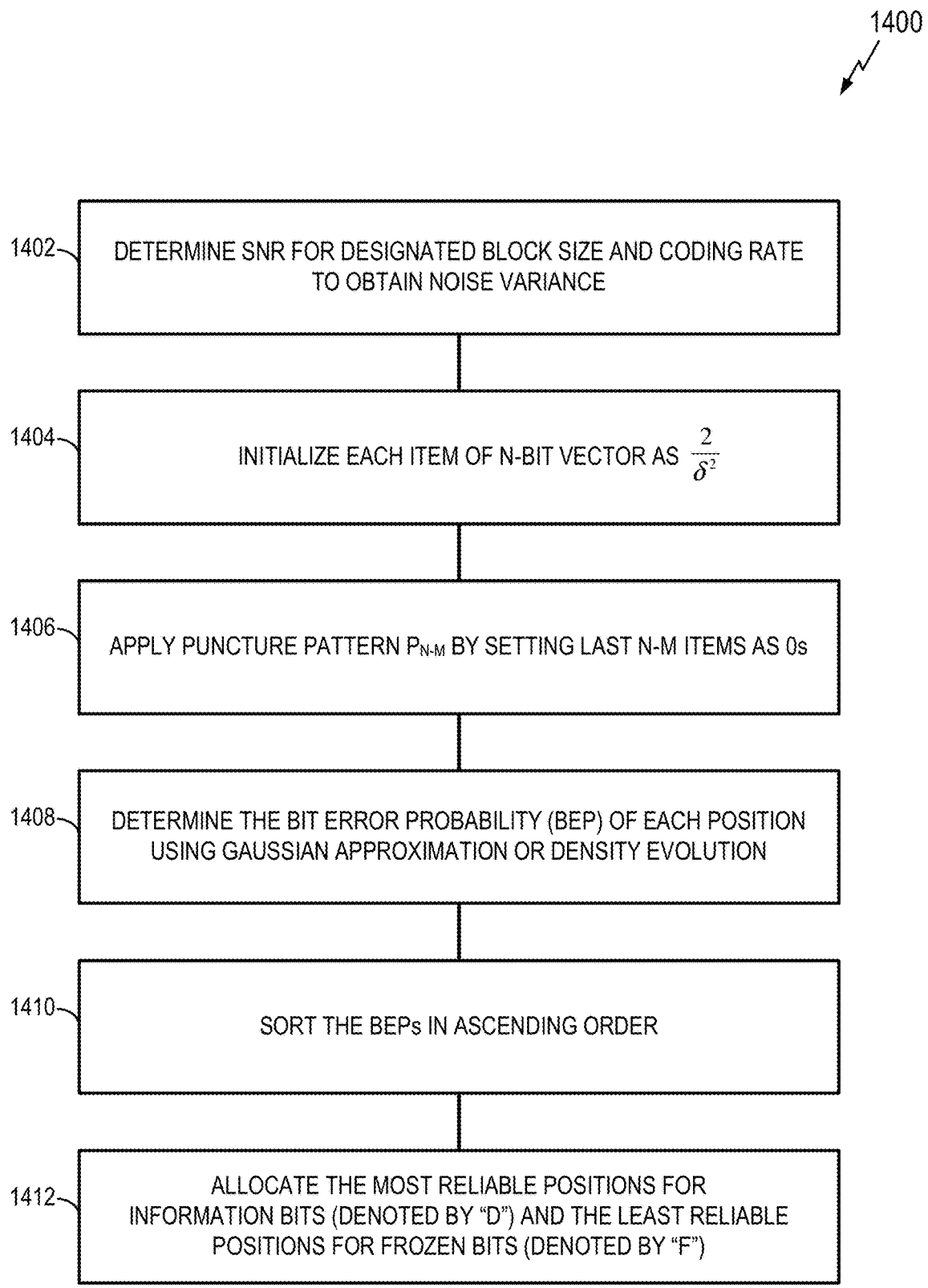
FIG. 14 is a flowchart illustrating an example of a process for determining positions of information bits in a mother code in accordance with some aspects of the disclosure.

FIG. 14 illustrates an example of a process 1400 for determining the positions of information bits in a mother code. The process 1400 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1400 may be implemented by any suitable apparatus capable of supporting communication-related operations.

At block 1402, an apparatus (e.g., a device that includes an encoder) determines the SNR applicable for a designated block size and coding rate. The corresponding noise variance value $\delta^2$ of the SNR is then used with the puncture pattern vectors 1300 of FIG. 13.

Figure 13:
FIG. 13 is a diagram of an example of determining positions of information bits in a mother code in accordance with some aspects of the disclosure.

At block 1404, the apparatus initializes each item of the N-bit vector 1302 of FIG. 13 to be $2/\delta^2$ as shown.

At block 1406, the apparatus the apparatus applies the puncture pattern $P_{N-M}$ (from Step 1) by setting the last N-M items as zeros. In FIG. 13, a corresponding puncture operation 1304 thus results in the illustrated vector after puncture 1306.

At block 1408, the apparatus determines the bit error probability (BEP) of each position using Gaussian approximation (GA) or density evolution (DE). At block 1410, the apparatus then sorts the BEPs in ascending order. In FIG. 13, corresponding BEP and sorting operations 1308 thus result in the illustrated vector with sorted bits 1310.

At block 1412, the apparatus allocates the most reliable positions for information bits (denoted by "D" in FIG. 13) and allocates the least reliable positions for frozen bits (denoted by "F" in FIG. 13).

Step 3—Obtain the Final Puncture Pattern $P_{N-L}$

The final puncture pattern $P_{N-L}$ is obtained by running the two operations set forth in Steps 3a and 3b M-L times (i.e., an iterative puncture pattern selection process).

Step 3a—Determine the puncture pattern $P_{N-M+1}$ i=1, . . . , M-L

The puncture pattern $P_{N-M+i}$ is used for puncturing N-M+i bits. To get the nested structure, the puncture pattern $P_{N-M+i}$ is obtained by adding one more zero into the positions of the 1 fields in the puncture pattern $P_{N-M+i}$. Because there are M-i+1 M-i+1 is in the puncture pattern $P_{N-M+i-1}$, there are M-i+1 possible puncture patterns for $P_{N-M+i}$. Using the procedure described in the previous subsection, the BEP set for all the possible puncture patterns may be obtained through the use of GA, DE, or some other suitable algorithm. The corresponding block error rate (BLER) can be obtained by calculating the sum of the BEPs in the positions for information bits. The puncture pattern with the minimum BLER will be selected as the puncture pattern M-i+1.

Step 3b—Update the Construct SNR for GA

Because the construct SNR may become larger with an increase in the number of puncture bits, the construct SNR is increased if more coded bits are punctured. Therefore, the construct SNR may be updated after the puncture pattern $P_{N-M+i}$ is determined. The procedure may be similar as the one for determining the puncture pattern $P_{N-M+i}$. First, the puncture pattern is fixed as $P_{N-M+i}$. Then, the construct SNR is set as $S_{initial}+\Delta$ and the BLER of information bits is determined. The step $\Delta$ is a fixed value (e.g., a value of 0.01 dB or some other suitable value). If the calculated BLER is lower than the target BLER, the current construct SNR will be used for determining the next puncture pattern $P_{N-M+i+1}$. Otherwise, the construct SNR is increased by one step $\Delta$ and the BLER of the information bits is calculated again. The loop will terminate once the obtained BLER is less than (or equal to) the target BLER.

The puncture positions are nested because the current puncture pattern includes the punctured bits in the previous puncture pattern. Therefore, the disclose puncture pattern generation scheme is very flexible for rate matching.

Example Iterative Processes

FIGS. 15-18 illustrate several iterative processes corresponding to Steps 3a and 3b. Specifically, FIGS. 15-17 correspond in some aspects to Step 3a and FIG. 18 corresponds in some aspects to Step 3b.

Figure 15:
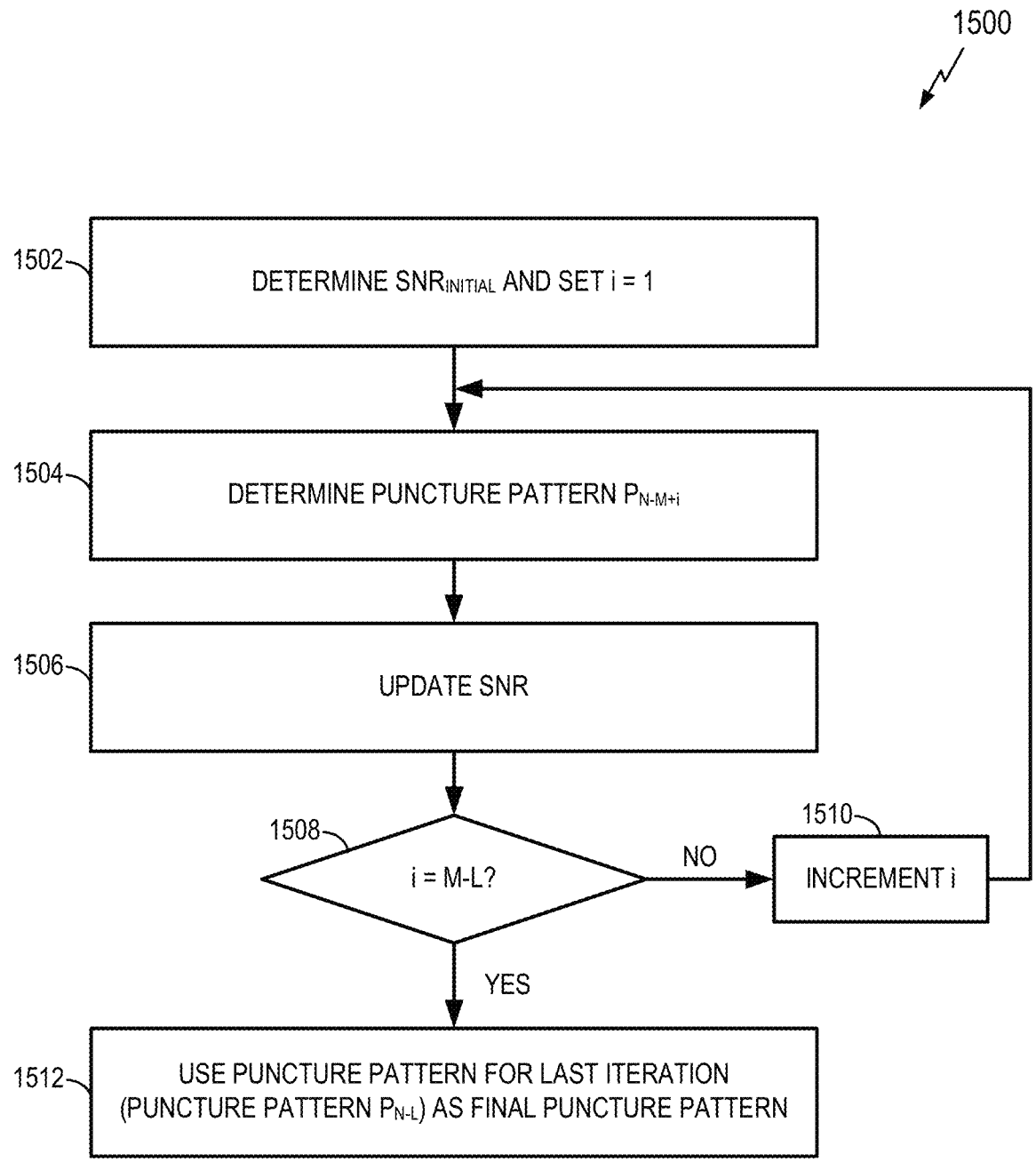
FIG. 15 is a flowchart illustrating an example of an iterative process for generating a puncture pattern in accordance with some aspects of the disclosure.

FIG. 15 illustrates an example of an iterative process 1500 for determining a puncture pattern for puncturing the mother code. The process 1500 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1500 may be implemented by any suitable apparatus capable of supporting communication-related operations.

At block 1502, an apparatus (e.g., a device that includes an encoder) determines $SNR_{initial}$ and sets i=1.

At block 1504, the apparatus determines the puncture pattern $P_{N-M+i}$ for the current iteration of i. This operation is described in more detail below in conjunction with FIG. 16.

At block 1506, the apparatus updates the SNR (e.g., to obtain a new noise variance value) for the next iteration of the loop. As discussed above, the SNR may change as the number of puncture bits changes.

At block 1508, the apparatus determines whether the last iteration of the loop has completed. If i≠M-L, the process continues to block 1510, where i is incremented. The process flow then returns to block 1504 for the next iteration of the loop.

If i=M-L at block 1508, the process flow passes to block 1512. Here, the puncture pattern for the last iteration of the loop (for i=M-L) is used as the final puncture pattern. For example, this puncture pattern could be used at block 1104 of FIG. 11.

Figure 16:
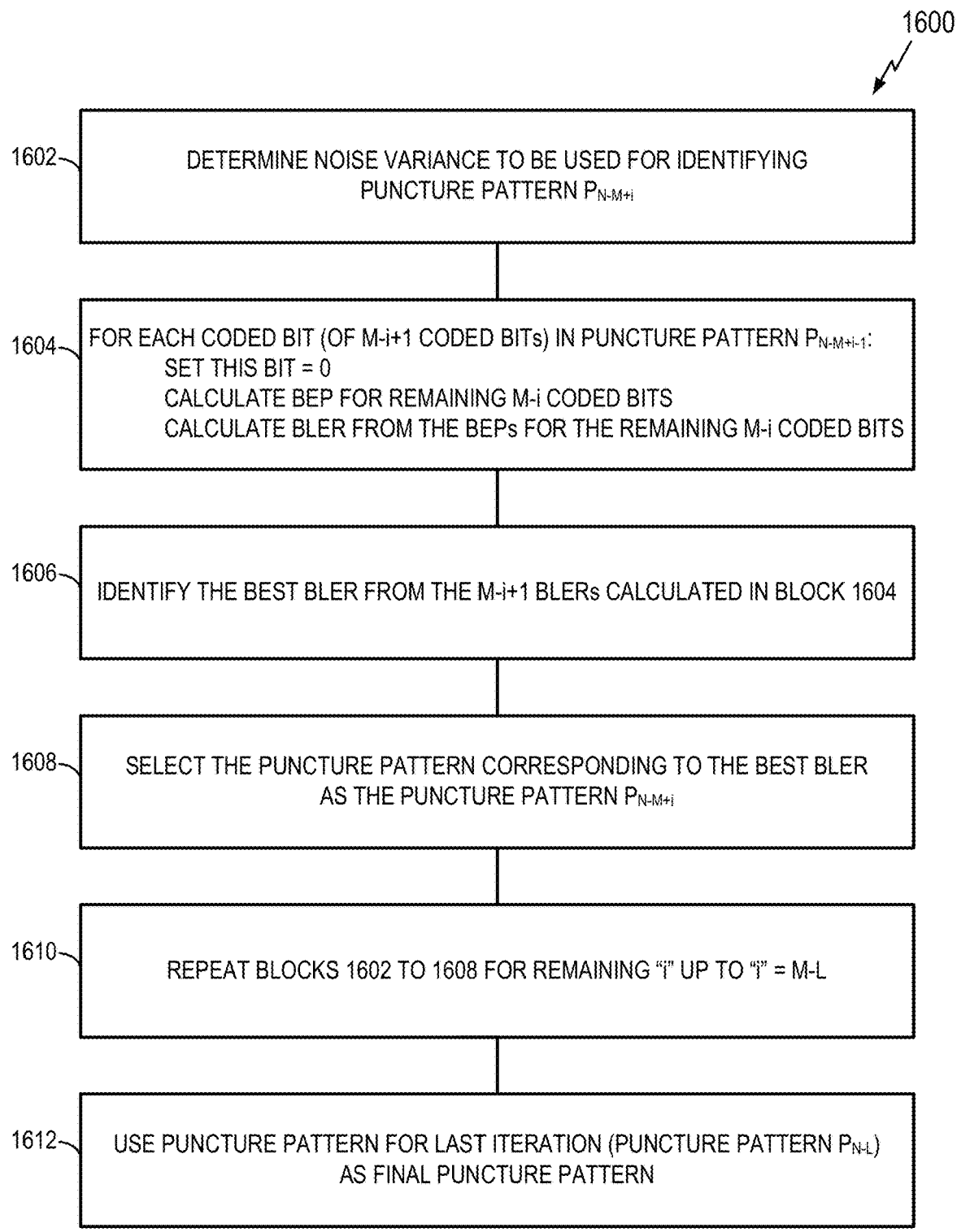
FIG. 16 is a flowchart illustrating an example of an iterative process for determining a puncture pattern in accordance with some aspects of the disclosure.

FIG. 16 illustrates a more detailed example of an iterative process 1600 for determining a puncture pattern for puncturing the mother code. The process 1600 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1600 may be implemented by any suitable apparatus capable of supporting communication-related operations.

The process 1600 involves generating, in succession, a series of preliminary puncture patterns where each successive preliminary puncture pattern has one more puncture bit than the immediately prior preliminary puncture pattern. For example, the first preliminary puncture pattern includes the number of puncture bits from the mother code (N-M) plus 1. The second preliminary puncture pattern includes the number of puncture bits from the first preliminary puncture pattern plus 1, and so on, until a last preliminary puncture pattern having the designated number of puncture bits for puncturing the mother code (i=M-L) is obtained. Specifically, the last preliminary puncture pattern will have N-L puncture bits (N-M puncture bits from the puncture pattern $P_{N-M}$ plus M-L puncture bits added by the successive generation of the M-L preliminary puncture patterns).

For each of the preliminary puncture patterns, the optimum position of the puncture bit added for that preliminary puncture pattern (i.e., at that iteration of the loop) is determined. As discussed above, this is determined by comparing the BLERs corresponding to the different potential positions of the newly added puncture bit (within the coded bits). The pattern corresponding to the bit position with the lowest BLER is designated as the final preliminary puncture pattern.

The iterative process is repeated until the last preliminary puncture pattern is generated. At each iteration of the loop, another puncture bit is added and the best position for that bit (and, hence the corresponding preliminary puncture pattern) is identified.

Figure 17:
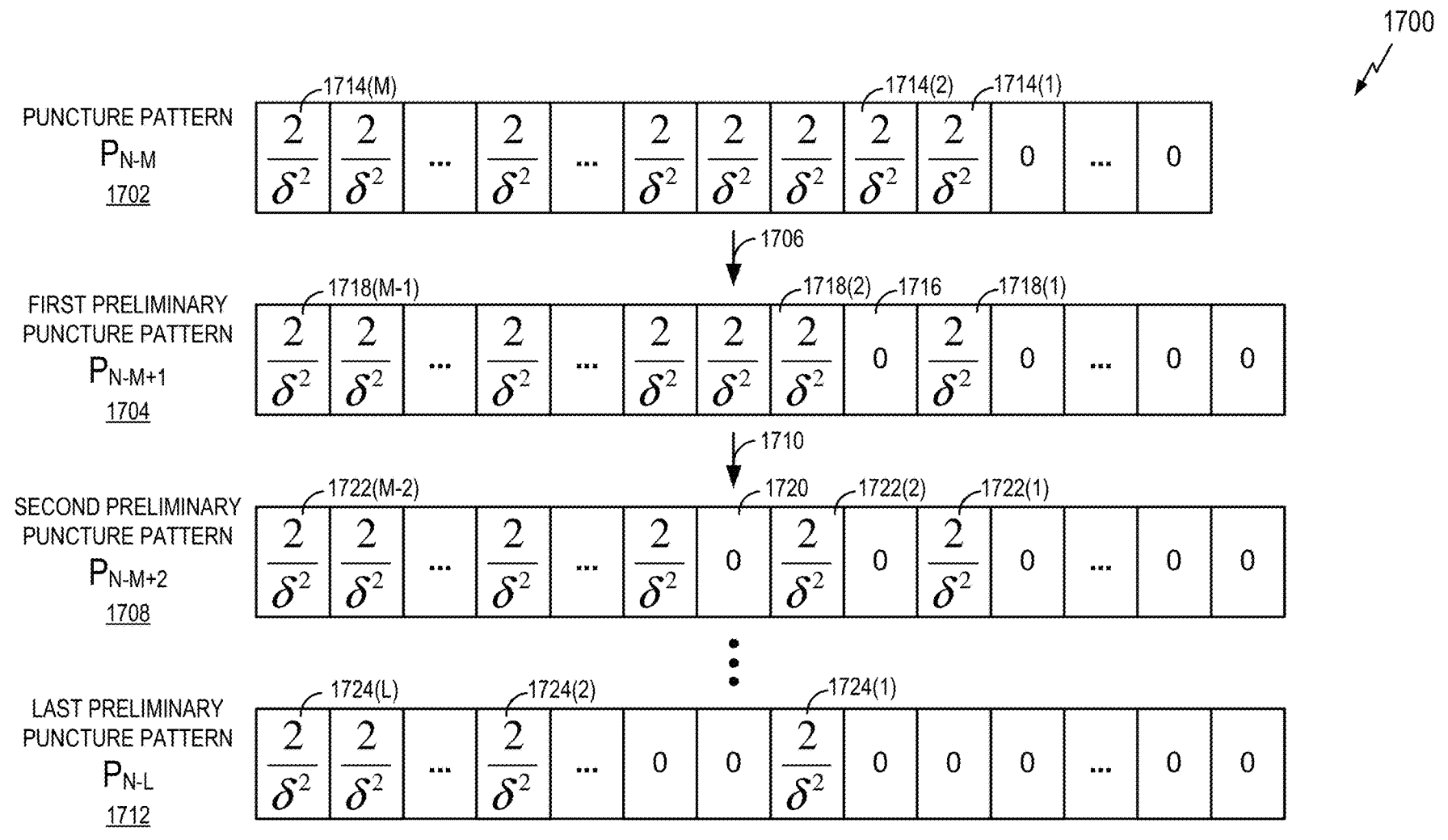

FIG. 17 shows a set of preliminary puncture patterns 1700. The preliminary puncture patterns are generated in succession, starting with the puncture pattern $P_{N-M}$ 1702 that was used to generate the mother code. The first preliminary puncture pattern $P_{N-M+1}$ 1704, generated after a first iteration 1706 of the loop, has one more puncture bit relative to the puncture pattern $P_{N-M}$ 1702. The second preliminary puncture pattern $P_{N-M+2}$ 1708, generated after a second iteration 1710 of the loop, has one more puncture bit relative to the first preliminary puncture pattern $P_{N-M+1}$ 1704. The last preliminary puncture pattern $P_{N-M+1}$ 1712, generated after M-L iterations of the loop, has M-L more puncture bits relative to the puncture pattern $P_{N-M}$ 1702.

The puncture pattern $P_{N-M}$ 1702 includes M encoded bits 1714(1), 1714(2), through 1714(M) along with N-M puncture bits. The M encoded bits 1714(1), 1714(2), through 1714(M) are populated using a noise variance value $\delta^2$ calculated specifically for the generation of the puncture pattern $P_{N-M}$ 1702.

The first preliminary puncture pattern $P_{N-M+1}$ 1704 includes an additional puncture bit 1716. As discussed herein, the best position for this additional puncture bit among the M encoded bits 1714(1), 1714(2), through 1714(M) of the puncture pattern $P_{N-M}$ 1702 is identified by calculating, in succession, the BLER for the case where the puncture bit is at bit 1714(1), the BLER for the case where the puncture bit is at bit 1714(2), and so on through the case where the puncture bit is at bit 1714(M). The lowest BLER from these M BLERs is identified and the corresponding bit position is selected as the puncture bit 1716 for the first preliminary puncture pattern $P_{N-M+1}$ 1704.

The identified first preliminary puncture pattern $P_{N-M+1}$ 1704 has M-1 encoded bits 1718(1), 1718(2), through 1718(M-1) along with N-M+1 puncture bits. The M-1 encoded bits 1716(1), 1716(2), through 1718(M-1) are populated using a noise variance value $\delta^2$ calculated specifically for the generation of the first preliminary puncture pattern $P_{N-M+1}$ 1704.

The second preliminary puncture pattern $P_{N-M+2}$ 1708 includes another puncture bit 1720. Again, the best position for this additional puncture bit among the M-1 encoded bits 1718(1), 1718(2), through 1718(M-1) of the puncture pattern $P_{N-M+1}$ 1704 is identified by calculating, in succession, the BLER for the case where the puncture bit is at bit 1718(1), the BLER for the case where the puncture bit is at bit 1718(2), and so on through the case where the puncture bit is at bit 1718(M-1). The lowest BLER from these M-1 BLERs is identified and the corresponding bit position is selected as the puncture bit 1720 for the second preliminary puncture pattern $P_{N-M+2}$ 1708.

The identified second preliminary puncture pattern $P_{N-M+2}$ 1708 has M-2 encoded bits 1722(1), 1722(2), through 1722(M-2) along with N-M+2 puncture bits. The M-2 encoded bits 1722(1), 1722(2), through 1722(M-2) are populated using a noise variance value $\delta^2$ calculated specifically for the generation of the second preliminary puncture pattern $P_{N-M+2}$ 1708.

The above operations are repeated for each iteration of the loop until the last preliminary puncture pattern $P_{N-L}$ 1712 is generated. The last preliminary puncture pattern $P_{N-L}$ 1712 has L encoded bits 1724(1), 1724(2), through 1724(L) along with N-L puncture bits. The L encoded bits 1724(1), 1724 (2), through 1724(L) are populated using a noise variance value $\delta^2$ calculated specifically for the generation of the last preliminary puncture pattern $P_{N-L}$ 1712.

Referring now to the details of FIG. 16, blocks 1602 through 1608 represent operations performed to generate a preliminary puncture pattern. According, an apparatus (e.g., a device that includes an encoder) repeatedly performs blocks 1602 through 1608 M-L times to successively generate the first preliminary puncture pattern, the second preliminary puncture pattern, and so on through the last preliminary puncture pattern.

At block 1602, the apparatus determines the noise variance to be used for identifying the puncture pattern $P_{N-M+i}$. For example, the apparatus may determine the SNR for the number of encoded bits (M-i) for the current iteration of the loop as discussed in more detail below in conjunction with FIG. 18.

At block 1604, for each of the M-i+1 coded bits (i.e., for each potential puncture bit position) of the current iteration of the preliminary puncture pattern $P_{N-M+i+1}$, the apparatus: sets the bit to 0; calculates the BEP for each of the remaining M-i bits; and calculates the BLER from the BEPs for these remaining M-i bits (e.g., by adding the BEPs).

At block 1606, the apparatus identifies the best BLER from the M-i+1 BLERs calculated at block 1604. For example, the apparatus may identify the BLER of the set of BLERs having the lowest value.

At block 1608, the apparatus selects a puncture pattern corresponding to the best BLER as the puncture pattern this iteration of the loop. In the event more than on BLER was identified at block 1606 as having the lowest value, a tie-breaking procedure may be employed to select one of the potential patterns. For example, the candidate puncture pattern having the puncture bit position associated with the lowest reliability may be selected.

At block 1610, the apparatus repeats block 1602 to 1608 for the remaining values of i up to i=M-L. Thus, at the end of this iterative procedure, the last puncture pattern generated with be puncture pattern $P_{N-L}$.

At block 1612, the apparatus uses the puncture pattern for the last iteration of the loop (puncture pattern $P_{N-L}$) as the final puncture pattern to be used to puncture the mother code. For example, the last preliminary puncture pattern $P_{N-L}$ 1712 of FIG. 17 may be used in block 1512 of FIG. 15, block 1104 of FIG. 11, or block 806 of FIG. 8.

Figure 18:
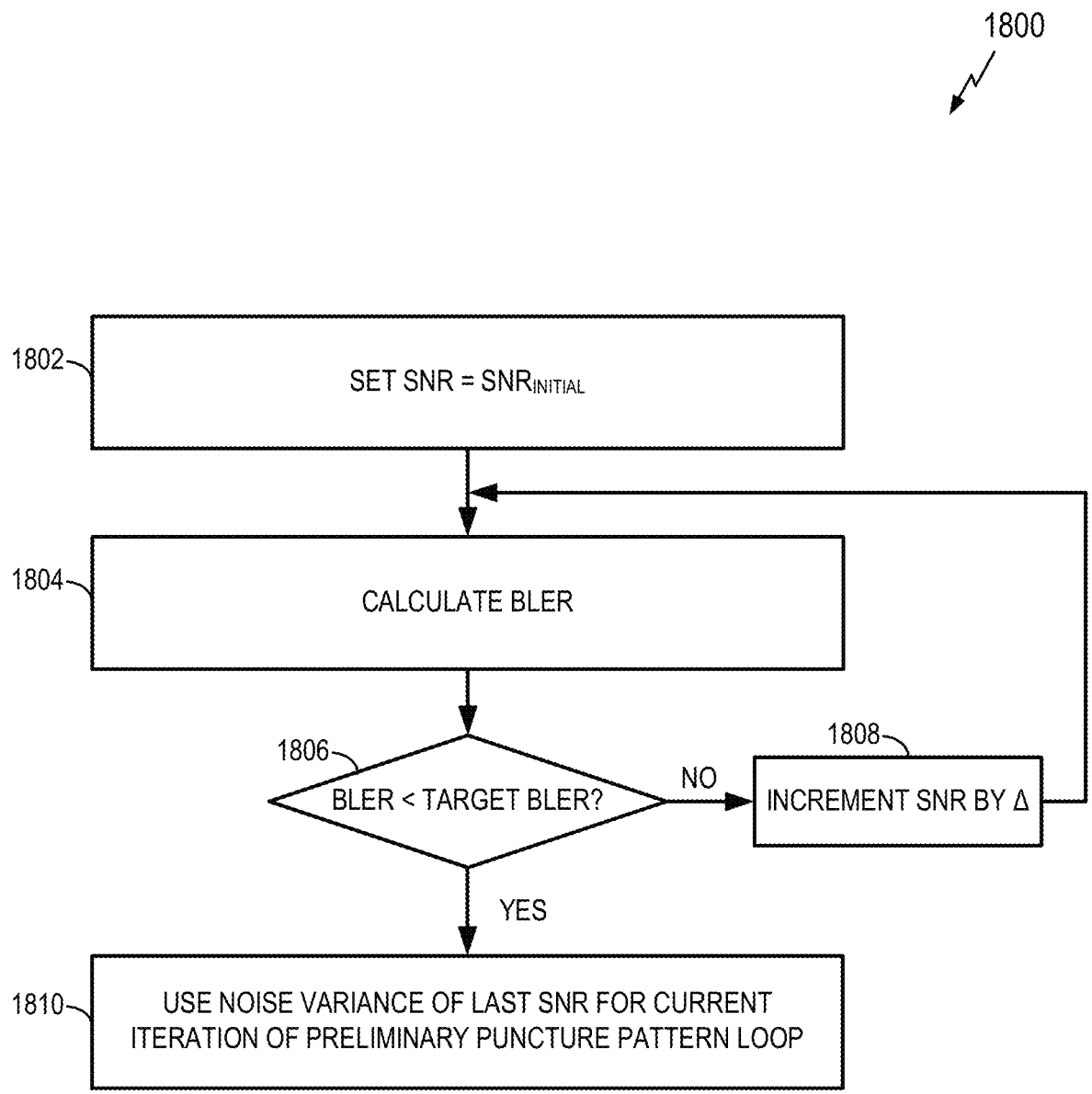
FIG. 18 is a flowchart illustrating an example of a process for determining an SNR for the generation of a preliminary puncture pattern in accordance with some aspects of the disclosure.

FIG. 18 illustrates an example of an iterative process 1800 for determining a noise variance for generating a given preliminary puncture pattern. The process 1800 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 1800 may be implemented by any suitable apparatus capable of supporting communication-related operations.

At block 1802, an apparatus (e.g., a device that includes an encoder) initially sets the SNR to be used in the iterative process 1800 equal to $SNR_{initial}$. In some implementations, $SNR_{initial}$ is calculated as an average SNR over a period of time.

At block 1804, the apparatus calculates the BLER based on the current value of SNR. Thus, for the first iteration of the loop, the SNR used for the BLER calculation is equal to $SNR_{initial}$.

At block 1808, the apparatus determines whether the BLER calculated at block 1804 is less than a target BLER. If the BLER is less than the target BLER, the process continues to block 1808, where the SNR is incremented by the step 4. The process flow then returns to block 1804 for the next iteration of the loop. Accordingly, for the second iteration of the loop (if applicable), the SNR used for the BLER calculation is equal to $SNR_{initial}+\Delta$. For the third iteration of the loop (if applicable), the SNR used for the BLER calculation is equal to $SNR_{initial}+2\Delta$, and so on. The value of the step $\Delta$ may be selected, for example, as a compromise between the desired level of accuracy (higher accuracy with a smaller $\Delta$) and the computation cost (higher cost with a larger $\Delta$).

If the BLER is not less than the target BLER at block 1806, the process flow passes to block 1810. Here, the noise variance of the last SNR (i.e., the SNR that resulted in the BLER being less than or equal to the target BLER) is used as the noise variance for the current iteration of the preliminary puncture pattern loop. For example, this noise variance could be used at block 1602 of FIG. 16.

Example Encoder and Decoder

Figure 19:
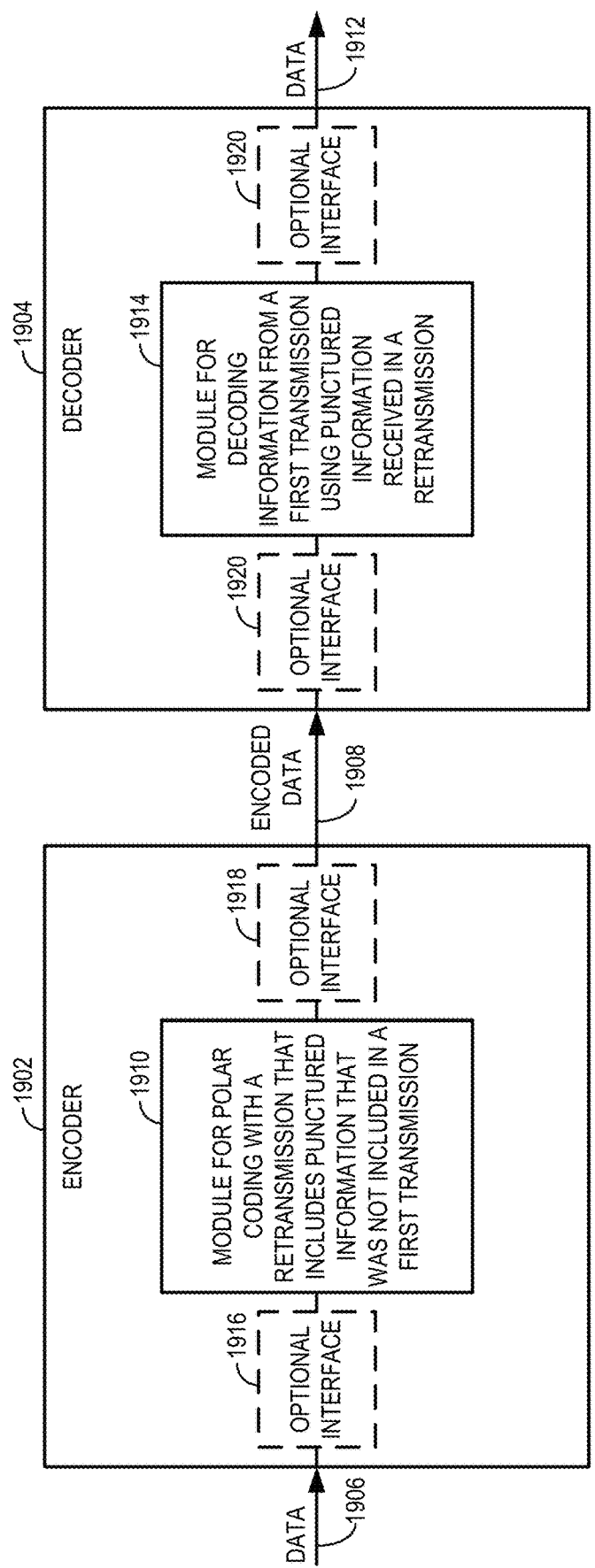
FIG. 19 is a block diagram of example encoder and decoder devices in accordance with some aspects of the disclosure.

FIG. 19 illustrates an example encoder 1902 and an example decoder 1904 constructed in accordance with the teachings herein. In some aspects, the encoder 1902 and the decoder 1904 may correspond to the encoder 212 and the decoder 214 of FIG. 2, respectively.

The encoder 1902 encodes data 1906 to generate encoded data 1908. In accordance with the teachings herein, the encoder 1902 may include a module for Polar coding with a retransmission that includes punctured information that was not included in a first transmission 1910.

The decoder 1904 decodes the encoded data 1908 (e.g., after transmission over a communication channel, not shown) to provide recovered data 1912. In accordance with the teachings herein, the decoder 1904 may include a module for decoding information from a first transmission using punctured information received in a retransmission 1914.

In some implementations, the encoder 1902 may include an interface 1916, an interface 1918, or both. Such an interface may include, for example, an interface bus, bus drivers, bus receivers, other suitable circuitry, or a combination thereof. For example, the interface 1916 may include receiver devices, buffers, or other circuitry for receiving a signal. As another example, the interface 1918 may include output devices, drivers, or other circuitry for sending a signal. In some implementations, the interfaces 1916 and 1918 may be configured to interface one or more other components of the encoder 1902 (other components not shown in FIG. 19).

In some implementations, the decoder 1904 may include an interface 1920, an interface 1922, or both. Such an interface may include, for example, an interface bus, bus drivers, bus receivers, other suitable circuitry, or a combination thereof. For example, the interface 1920 may include receiver devices, buffers, or other circuitry for receiving a signal. As another example, the interface 1922 may include output devices, drivers, or other circuitry for sending a signal. In some implementations, the interfaces 1920 and 1922 may be configured to interface one or more other components of the decoder 1904 (other components not shown in FIG. 19).

The encoder 1902 and the decoder 1904 may take different forms in different implementations. In some cases, the encoder 1902 and/or the decoder 1904 may be an integrated circuit. In some cases, the encoder 1902 and/or the decoder 1904 may be included in an integrated circuit that includes other circuitry (e.g., a processor and related circuitry).

Example Apparatus

Figure 20:
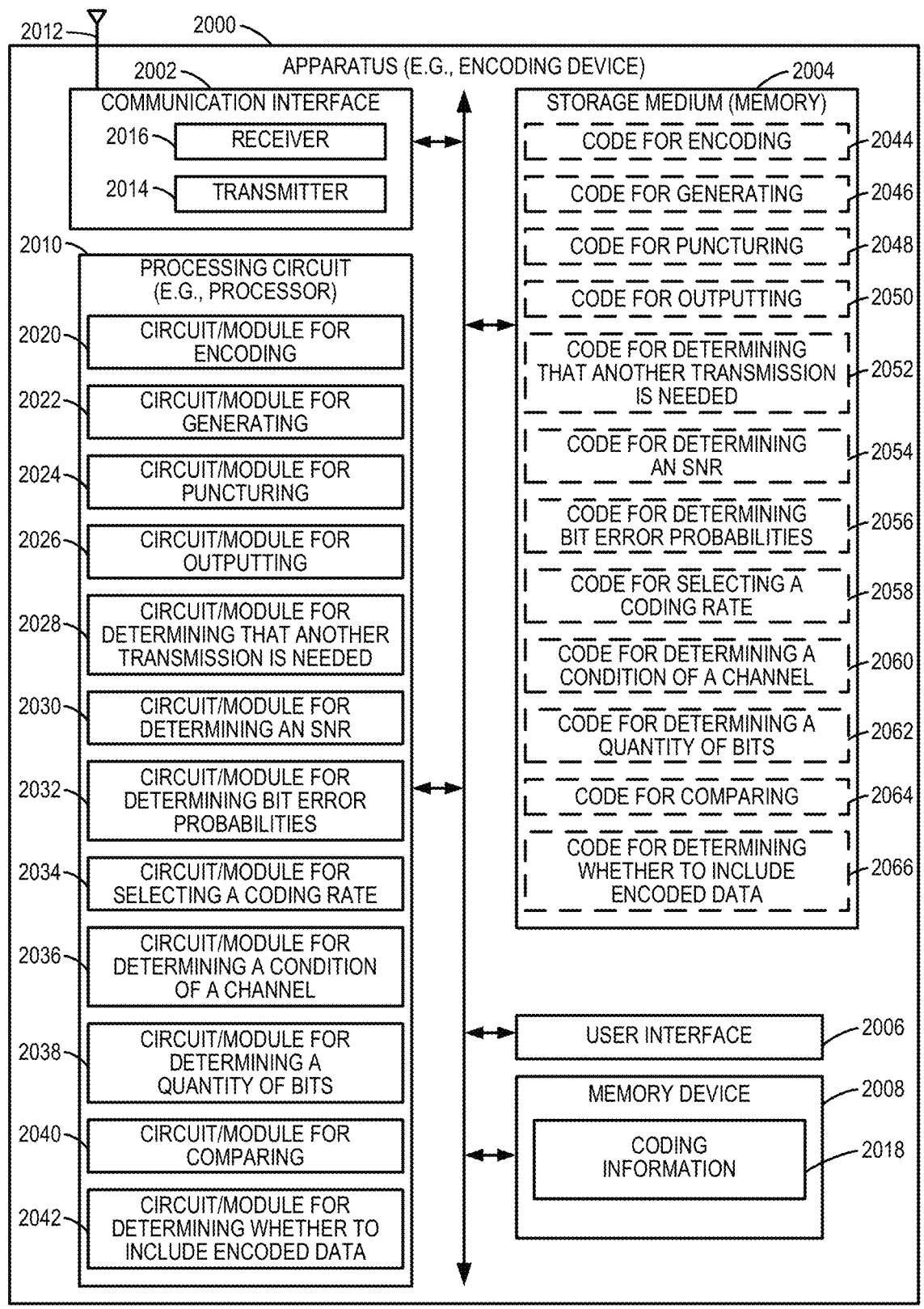
FIG. 20 is a block diagram illustrating an example hardware implementation for an apparatus (e.g., an electronic device) that provides encoding in accordance with some aspects of the disclosure.

FIG. 20 illustrates a block diagram of an example hardware implementation of an apparatus 2000 configured to use encoding according to one or more aspects of the disclosure. The apparatus 2000 could embody or be implemented within a UE, a transmit receive point (TRP), a gNB, a base station, or some other type of device that supports encoding as taught herein. In various implementations, the apparatus 2000 could embody or be implemented within an access terminal, an access point, or some other type of device. In various implementations, the apparatus 2000 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 2000 includes a communication interface 2002 (e.g., at least one transceiver), a storage medium 2004, a user interface 2006, a memory device 2008, and a processing circuit 2010 (e.g., at least one processor). These components can be coupled to and/or placed in electrical communication with one another via a signaling bus or other suitable component, represented generally by the connection lines in FIG. 20. The signaling bus may include any number of interconnecting buses and bridges depending on the specific application of the processing circuit 2010 and the overall design constraints. The signaling bus links together various circuits such that each of the communication interface 2002, the storage medium 2004, the user interface 2006, and the memory device 2008 are coupled to and/or in electrical communication with the processing circuit 2010. The signaling bus may also link various other circuits (not shown) such as timing sources, peripherals, voltage regulators, and power management circuits, which are well known in the art, and therefore, will not be described any further.

The communication interface 2002 may be adapted to facilitate wireless communication of the apparatus 2000. For example, the communication interface 2002 may include circuitry and/or programming adapted to facilitate the communication of information bi-directionally with respect to one or more communication devices in a network. Thus, in some implementations, the communication interface 2002 may be coupled to one or more antennas 2012 for wireless communication within a wireless communication system. In some implementations, the communication interface 2002 may be configured for wire-based communication. For example, the communication interface 2002 could be a bus interface, a send/receive interface, or some other type of signal interface including drivers, buffers, or other circuitry for outputting and/or obtaining signals (e.g., outputting signal from and/or receiving signals into an integrated circuit). The communication interface 2002 can be configured with one or more standalone receivers and/or transmitters, as well as one or more transceivers. In the illustrated example, the communication interface 2002 includes a transmitter 2014 and a receiver 2016.

The memory device 2008 may represent one or more memory devices. As indicated, the memory device 2008 may maintain coding-related information 2018 along with other information used by the apparatus 2000. In some implementations, the memory device 2008 and the storage medium 2004 are implemented as a common memory component. The memory device 2008 may also be used for storing data that is manipulated by the processing circuit 2010 or some other component of the apparatus 2000.

The storage medium 2004 may represent one or more computer-readable, machine-readable, and/or processor-readable devices for storing programming, such as processor executable code or instructions (e.g., software, firmware), electronic data, databases, or other digital information. The storage medium 2004 may also be used for storing data that is manipulated by the processing circuit 2010 when executing programming. The storage medium 2004 may be any available media that can be accessed by a general purpose or special purpose processor, including portable or fixed storage devices, optical storage devices, and various other mediums capable of storing, containing or carrying programming.

By way of example and not limitation, the storage medium 2004 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 2004 may be embodied in an article of manufacture (e.g., a computer program product). By way of example, a computer program product may include a computer-readable medium in packaging materials. In view of the above, in some implementations, the storage medium 2004 may be a non-transitory (e.g., tangible) storage medium.

The storage medium 2004 may be coupled to the processing circuit 2010 such that the processing circuit 2010 can read information from, and write information to, the storage medium 2004. That is, the storage medium 2004 can be coupled to the processing circuit 2010 so that the storage medium 2004 is at least accessible by the processing circuit 2010, including examples where at least one storage medium is integral to the processing circuit 2010 and/or examples where at least one storage medium is separate from the processing circuit 2010 (e.g., resident in the apparatus 2000, external to the apparatus 2000, distributed across multiple entities, etc.).

Programming stored by the storage medium 2004, when executed by the processing circuit 2010, causes the processing circuit 2010 to perform one or more of the various functions and/or process operations described herein. For example, the storage medium 2004 may include operations configured for regulating operations at one or more hardware blocks of the processing circuit 2010, as well as to utilize the communication interface 2002 for wireless communication utilizing their respective communication protocols. In some aspects, the storage medium 2004 may be a non-transitory computer-readable medium storing computer-executable code, including code to perform operations as described herein.

The processing circuit 2010 is generally adapted for processing, including the execution of such programming stored on the storage medium 2004. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 2010 is arranged to obtain, process and/or send data, control data access and storage, issue commands, and control other desired operations. The processing circuit 2010 may include circuitry configured to implement desired programming provided by appropriate media in at least one example. For example, the processing circuit 2010 may be implemented as one or more processors, one or more controllers, and/or other structure configured to execute executable programming Examples of the processing circuit 2010 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2010 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2010 are for illustration and other suitable configurations within the scope of the disclosure are also contemplated.

According to one or more aspects of the disclosure, the processing circuit 2010 may be adapted to perform any or all of the features, processes, functions, operations and/or routines for any or all of the apparatuses described herein. For example, the processing circuit 2010 may be configured to perform any of the steps, functions, and/or processes described with respect to FIGS. 1-19 and 21-27. As used herein, the term "adapted" in relation to the processing circuit 2010 may refer to the processing circuit 2010 being one or more of configured, used, implemented, and/or programmed to perform a particular process, function, operation and/or routine according to various features described herein.

The processing circuit 2010 may be a specialized processor, such as an application specific integrated circuit (ASIC) that serves as a means for (e.g., structure for) carrying out any one of the operations described in conjunction with FIGS. 1-19 and 21-27. The processing circuit 2010 may serve as one example of a means for transmitting and/or a means for receiving. In various implementations, the processing circuit 2010 may provide and/or incorporate the functionality of the first wireless communication device 202 (e.g., the encoder 212) of FIG. 2 or the encoder 1902 of FIG. 19.

According to at least one example of the apparatus 2000, the processing circuit 2010 may include one or more of a circuit/module for encoding 2020, a circuit/module for generating 2022, a circuit/module for puncturing 2024, a circuit/module for outputting 2026, a circuit/module for determining that another transmission is needed 2028, a circuit/module for determining an SNR 2030, a circuit/module for determining bit error probabilities 2032, a circuit/module for selecting a coding rate 2034, a circuit/module for determining a condition of a channel 2036, a circuit/module for determining a quantity of bits 2038, a circuit/module for comparing 2040, or a circuit/module for determining whether to include encoded data 2042. In various implementations, the circuit/module for encoding 2020, the circuit/module for generating 2022, the circuit/module for puncturing 2024, the circuit/module for outputting 2026, the circuit/module for determining that another transmission is needed 2028, the circuit/module for determining an SNR 2030, the circuit/module for determining bit error probabilities 2032, the circuit/module for selecting a coding rate 2034, the circuit/module for determining a condition of a channel 2036, the circuit/module for determining a quantity of bits 2038, the circuit/module for comparing 2040, or the circuit/module for determining whether to include encoded data 2042 may provide and/or incorporate, at least in part, the functionality described above for the first wireless communication device 202 (e.g., the encoder 212) of FIG. 2 or the encoder 1902 of FIG. 19.

As mentioned above, programming stored by the storage medium 2004, when executed by the processing circuit 2010, causes the processing circuit 2010 to perform one or more of the various functions and/or process operations described herein. For example, the programming may cause the processing circuit 2010 to perform the various functions, steps, and/or processes described herein with respect to FIGS. 1-19 and 21-27 in various implementations. As shown in FIG. 20, the storage medium 2004 may include one or more of code for encoding 2044, code for generating 2046, code for puncturing 2048, code for outputting 2050, code for determining that another transmission is needed 2052, code for determining an SNR 2054, code for determining bit error probabilities 2056, code for selecting a coding rate 2058, code for determining a condition of a channel 2060, code for determining a quantity of bits 2062, code for comparing 2064, or code for determining whether to include encoded data 2066. In various implementations, the code for encoding 2044, the code for generating 2046, the code for puncturing 2048, the code for outputting 2050, the code for determining that another transmission is needed 2052, the code for determining an SNR 2054, the code for determining bit error probabilities 2056, the code for selecting a coding rate 2058, the code for determining a condition of a channel 2060, the code for determining a quantity of bits 2062, the code for comparing 2064, or the code for determining whether to include encoded data 2066 may be executed or otherwise used to provide the functionality described herein for the circuit/module for encoding 2020, the circuit/module for generating 2022, the circuit/module for puncturing 2024, the circuit/module for outputting 2026, the circuit/module for determining that another transmission is needed 2028, the circuit/module for determining an SNR 2030, the circuit/module for determining bit error probabilities 2032, the circuit/module for selecting a coding rate 2034, the circuit/module for determining a condition of a channel 2036, the circuit/module for determining a quantity of bits 2038, the circuit/module for comparing 2040, or the circuit/module for determining whether to include encoded data 2042.

The circuit/module for encoding 2020 may include circuitry and/or programming (e.g., code for encoding 2044 stored on the storage medium 2004) adapted to perform several functions relating to, for example, encoding information. In some aspects, the circuit/module for encoding 2020 (e.g., a means for encoding) may correspond to, for example, a processing circuit.

In some aspects, the circuit/module for encoding 2020 may execute an encoding algorithm. For example, the circuit/module for encoding 2020 may perform a block coding algorithm or a Polar coding algorithm. In some aspects, the circuit/module for encoding 2020 may perform the encoding operations described herein conjunction with FIGS. 1-19 and 21-27. The circuit/module for encoding 2020 then outputs the resulting encoded information (e.g., to the circuit/module for puncturing 2024, the memory device 2008, the communication interface 2002, or some other component).

The circuit/module for generating 2022 may include circuitry and/or programming (e.g., code for generating 2046 stored on the storage medium 2004) adapted to perform several functions relating to, for example, generating a puncture pattern. In some aspects, the circuit/module for generating 2022 (e.g., a means for generating) may correspond to, for example, a processing circuit.

In some aspects, the circuit/module for generating 2022 may generate a puncture pattern to puncture a mother code and/or generate a puncture pattern via an iterative process. For example, the circuit/module for generating 2022 may perform puncture pattern generation operations as described herein conjunction with FIGS. 1-19 and 21-27. The circuit/module for generating 2022 then outputs the resulting puncture pattern (e.g., to the circuit/module for puncturing 2022, the memory device 2008, the communication interface 2002, or some other component).

The circuit/module for puncturing 2024 may include circuitry and/or programming (e.g., code for puncturing 2048 stored on the storage medium 2004) adapted to perform several functions relating to, for example, puncturing information. In some aspects, the circuit/module for puncturing 2024 (e.g., a means for puncturing) may correspond to, for example, a processing circuit.

In some aspects, the circuit/module for puncturing 2024 may puncture encoded data. For example, the circuit/module for puncturing 2024 may perform puncturing operations as described herein conjunction with FIGS. 1-19 and 21-27. The circuit/module for puncturing 2024 then outputs the resulting punctured information (e.g., to the circuit/module for outputting 2026, the memory device 2008, the communication interface 2002, or some other component).

The circuit/module for outputting 2026 may include circuitry and/or programming (e.g., code for outputting 2050 stored on the storage medium 2004) adapted to perform several functions relating to, for example, outputting (e.g., sending or transmitting) information. In some implementations, the circuit/module for outputting 2026 may obtain information (e.g., from the circuit/module for encoding 2020, the circuit/module for puncturing 2024, the memory device 2008, or some other component of the apparatus 2000) and process the information (e.g., encode the information for transmission). In some scenarios, the circuit/module for outputting 2026 sends the information to another component (e.g., the transmitter 2014, the communication interface 2002, or some other component) that will send the information to another device. In some scenarios (e.g., if the circuit/module for outputting 2026 includes a transmitter), the circuit/module for outputting 2026 transmits the information directly to another device (e.g., the ultimate destination) via radio frequency signaling or some other type of signaling suitable for the applicable communication medium.

The circuit/module for outputting 2026 (e.g., a means for outputting, a means for sending, a means for transmitting, etc.) may take various forms. In some aspects, the circuit/module for outputting 2026 may correspond to, for example, a processing circuit as discussed herein. In some aspects, the circuit/module for outputting 2026 may correspond to, for example, an interface (e.g., a bus interface, a send interface, or some other type of signal interface), a communication device, a transceiver, a transmitter, or some other similar component as discussed herein. In some implementations, the communication interface 2002 includes the circuit/module for outputting 2026 and/or the code for outputting 2050. In some implementations, the circuit/module for outputting 2026 and/or the code for outputting 2050 is configured to control the communication interface 2002 (e.g., a transceiver or a transmitter) to transmit information.

The circuit/module for determining that another transmission is needed 2028 may include circuitry and/or programming (e.g., code for determining that another transmission is needed 2052 stored on the storage medium 2004) adapted to perform several functions relating to, for example, determining whether to perform a retransmission. In some aspects, the circuit/module for determining that another transmission is needed 2028 (e.g., a means for determining that another transmission is needed) may correspond to, for example, a processing circuit.

In some scenarios, the circuit/module for determining that another transmission is needed 2028 may obtain feedback information. For example, the circuit/module for determining that another transmission is needed 2028 may obtain an ACK or NAK (e.g., from the communication interface 2002, the memory device 2008, or some other component of the apparatus 2000). The circuit/module for determining that another transmission is needed 2028 may elect to retransmit if the feedback is a NAK or some other similar value. The circuit/module for determining that another transmission is needed 2028 may then output an indication of the determination (e.g., to the circuit/module for outputting 2026, the memory device 2008, or some other component).

The circuit/module for determining an SNR 2030 may include circuitry and/or programming (e.g., code for determining an SNR 2054 stored on the storage medium 2004) adapted to perform several functions relating to, for example, determining an SNR for use in generating a puncture pattern. In some aspects, the circuit/module for determining an SNR 2030 (e.g., a means for generating) may correspond to, for example, a processing circuit.

In some aspects, the circuit/module for determining an SNR 2030 may perform puncture pattern generation operations as described herein conjunction with FIGS. 1-19 and 21-27. For example, the circuit/module for determining an SNR 2030 may determine a signal-to-noise ratio by increasing a preliminary signal-to-noise ratio until a block error rate for a preliminary puncture pattern is less than or equal to a target block error rate. The circuit/module for determining an SNR 2030 then outputs the resulting SNR (e.g., to the circuit/module for generating 2022, the memory device 2008, the communication interface 2002, or some other component).

The circuit/module for determining bit error probabilities 2032 may include circuitry and/or programming (e.g., code for determining bit error probabilities 2056 stored on the storage medium 2004) adapted to perform several functions relating to, for example, determining bit error probabilities for different positions of a puncture bit. In some aspects, the circuit/module for determining bit error probabilities 2032 (e.g., a means for generating) may correspond to, for example, a processing circuit.

In some aspects, the circuit/module for determining bit error probabilities 2032 may determine bit error probabilities as described herein conjunction with FIGS. 1-19 and 21-27. For example, the circuit/module for determining bit error probabilities 2032 may determine bit error probabilities based on a noise variance. In some cases, the determination of bit error probabilities may be based on a Gaussian approximation algorithm or a density evolution algorithm. The circuit/module for determining bit error probabilities 2032 then outputs the resulting puncture pattern (e.g., to the circuit/module for generating 2022, the memory device 2008, the communication interface 2002, or some other component).

The circuit/module for selecting a coding rate 2034 may include circuitry and/or programming (e.g., code for selecting a coding rate 2058 stored on the storage medium 2004) adapted to perform several functions relating to, for example, selecting a coding rate for encoding information. In some aspects, the circuit/module for selecting a coding rate 2034 (e.g., a means for selecting a coding rate) may correspond to, for example, a processing circuit.

The circuit/module for selecting a coding rate 2034 may select a coding rate based on various inputs. For example, the circuit/module for selecting a coding rate 2034 may select a coding rate based on a target error rate, a channel condition, or some other input. Thus, the circuit/module for selecting a coding rate 2034 may initially obtain input information (e.g., from the circuit/module for determining a condition of a channel 2036, the memory device 2008, or some other component of the apparatus 2000). The circuit/module for circuit/module for selecting a coding rate 2034 can thus determine the coding rate to be used based on the appropriate input (e.g., as discussed herein in conjunction with FIGS. 1-19 and 21-27). The circuit/module for selecting a coding rate 2034 may then output an indication of the selection (e.g., to the circuit/module for encoding 2020, the circuit/module for outputting 2026, the circuit/module for determining a quantity of bits 2038, the memory device 2008, an encoder, or some other component).

The circuit/module for determining a condition of a channel 2036 may include circuitry and/or programming (e.g., code for determining a condition of a channel 2060 stored on the storage medium 2004) adapted to perform several functions relating to, for example, determining a condition of a channel over a period of time. In some aspects, the circuit/module for determining a condition of a channel 2036 (e.g., a means for determining a condition of a channel) may correspond to, for example, a processing circuit.

In some scenarios, the circuit/module for determining a condition of a channel 2036 may invoke channel measurements. For example, the circuit/module for determining a condition of a channel 2036 may control the communication interface 2002 to monitor the channel (and optionally send patterns for channel measurements by another device), or control some other component of the apparatus 2000. The circuit/module for determining a condition of a channel 2036 can therefore obtain received signal information and process this information to generate at least one channel estimate. The circuit/module for determining a condition of a channel 2036 may then output an indication of the channel estimate (e.g., to the circuit/module for selecting a coding rate 2034, the memory device 2008, or some other component).

The circuit/module for determining a quantity of bits 2038 may include circuitry and/or programming (e.g., code for determining a quantity of bits 2062 stored on the storage medium 2004) adapted to perform several functions relating to, for example, determining how many bits (e.g., of previously transmitted encoded data) to use for a retransmission. In some aspects, the circuit/module for determining a quantity of bits 2038 (e.g., a means for determining a quantity of bits) may correspond to, for example, a processing circuit.

The circuit/module for determining a quantity of bits 2038 may determine the quantity of bits based on a coding rate. Thus, the circuit/module for determining a quantity of bits 2038 may obtain coding rate information (e.g., from the circuit/module for selecting a coding rate 2034, the memory device 2008, or some other component of the apparatus 2000). The circuit/module for determining a quantity of bits 2038 then calculates the number of bits to use based on the coding rate information (e.g., as discussed herein). The circuit/module for determining a quantity of bits 2038 may then output an indication of the number of bits (e.g., to the circuit/module for outputting 2026, the memory device 2008, the circuit/module for encoding 2020, an encoder, or some other component).

The circuit/module for comparing 2040 may include circuitry and/or programming (e.g., code for comparing 2064 stored on the storage medium 2004) adapted to perform several functions relating to, for example, comparing two values. In some aspects, the circuit/module for comparing 2040 (e.g., a means for comparing) may correspond to, for example, a processing circuit.

In one scenario, the circuit/module for comparing 2040 obtains a first coding rate and a second coding rate (e.g., from the circuit/module for selecting a coding rate 2034, the memory device 2008, or some other component of the apparatus 2000). The circuit/module for comparing 2040 determines which one of these value is larger than the other one of these values (e.g., by performing a subtraction operation). The circuit/module for comparing 2040 may then output the result of this determination (e.g., to the circuit/module for determining whether to include encoded data 2042, the memory device 2008, or some other component).

The circuit/module for determining whether to include encoded data 2042 may include circuitry and/or programming (e.g., code for determining whether to include encoded data 2066 stored on the storage medium 2004) adapted to perform several functions relating to, for example, determining whether to include encoded data in second information (e.g., for a retransmission). In some aspects, the circuit/module for determining whether to include encoded data 2042 (e.g., a means for determining whether to include encoded data) may correspond to, for example, a processing circuit.

In some scenarios, the circuit/module for determining whether to include encoded data 2042 may determine whether to include encoded data with a retransmission. For example, the circuit/module for determining whether to include encoded data 2042 may determine whether an obtained coding rate is less than the coding rate of a first transmission. If so, additional encoded bits may need to be transmitted to meet the target BLER for the second transmission. The circuit/module for determining whether to include encoded data 2042 may then output an indication of the above determination (e.g., to the circuit/module for outputting 2022, the communication interface 2002, the memory device 2008, or some other component).

First Example Process

Figure 21:
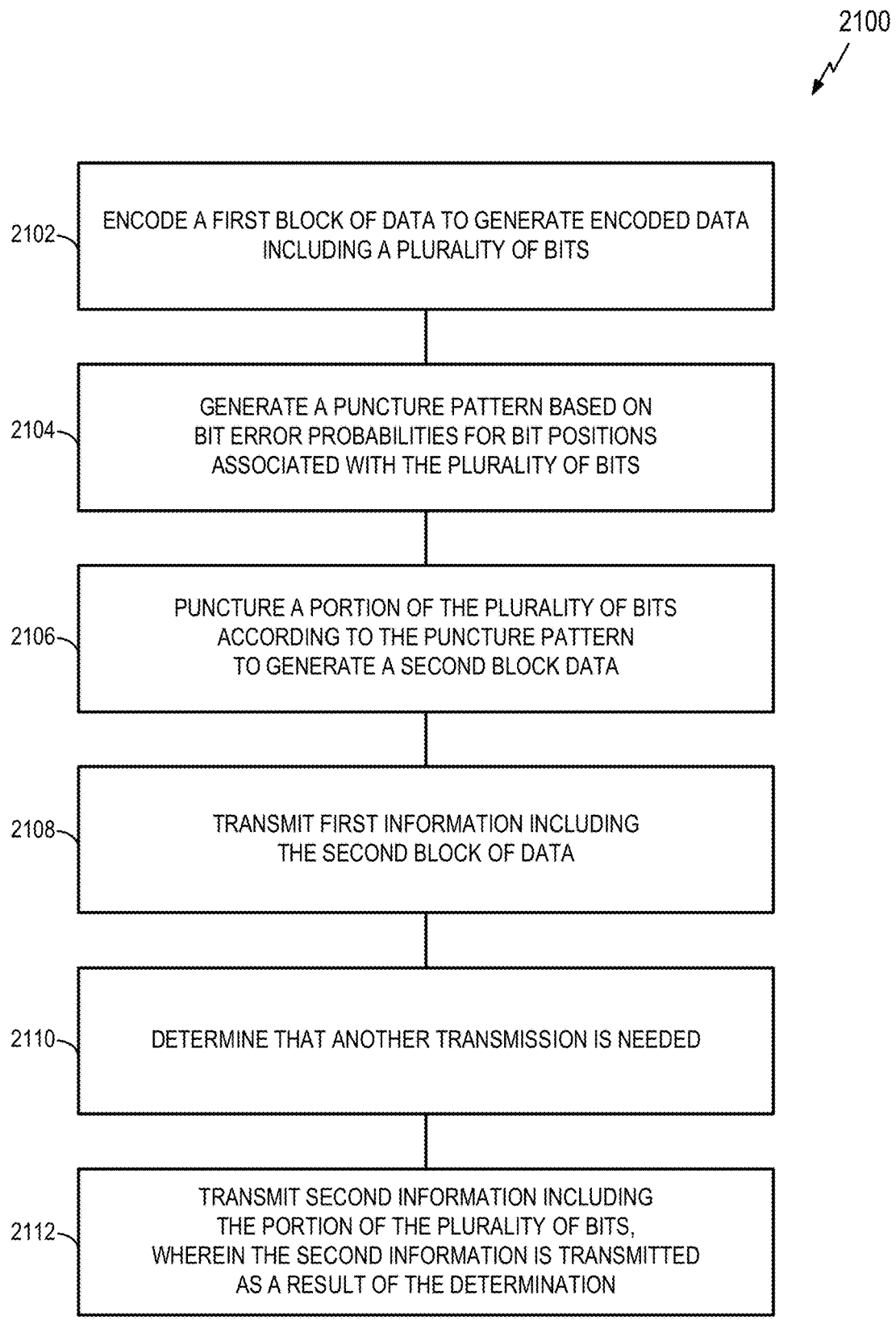
FIG. 21 is a flowchart illustrating an example of a communication process in accordance with some aspects of the disclosure.

FIG. 21 illustrates a process 2100 for communication in accordance with some aspects of the disclosure. The process 2100 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2100 may be implemented by any suitable apparatus capable of supporting communication-related operations.

At block 2102, an apparatus (e.g., a device that include an encoder) encodes a first block of data to generate encoded data including a plurality of bits. In some aspects, the encoding may include Polar coding.

In some implementations, the circuit/module for encoding 2020 of FIG. 20 performs the operations of block 2102. In some implementations, the code for encoding 2044 of FIG. 20 is executed to perform the operations of block 2102.

At block 2104, the apparatus generates a puncture pattern based on bit error probabilities for bit positions associated with the plurality of bits. The generation of the puncture pattern may take different forms in different implementations.

In some aspects, the generation of the puncture pattern may include generating a plurality of preliminary puncture patterns in succession from a first preliminary puncture pattern to a last preliminary puncture pattern, wherein a quantity of puncture bits in any one of the preliminary puncture patterns is different from a quantity of puncture bits in any other one of the preliminary puncture patterns, and selecting the last preliminary puncture pattern as a final puncture pattern. In some aspects, a quantity of puncture bits in the last preliminary puncture pattern may be greater than a quantity of puncture bits in any other one of the preliminary puncture patterns. In some aspects, the generation of the first preliminary puncture pattern may include calculating (calculation of) a plurality of block error rates based on a plurality of positions for a puncture bit, identifying (identification of) a lowest block error rate of the block error rates, and identifying the first preliminary puncture pattern based on the lowest block error rate.

In some aspects, the generation of the puncture pattern may include generating a first preliminary puncture pattern, and generating a second preliminary puncture pattern after the generation of the first preliminary puncture pattern. In some aspects, the generation of the first preliminary puncture pattern may include determining a first noise variance, and calculating a plurality of first block error rates based on a plurality of positions for a first puncture bit, wherein each first block error rate may be based on the first noise variance. In some aspects, the generation of the second preliminary puncture pattern may include determining a second noise variance that is different from the first noise variance, and calculating a plurality of second block error rates based on a plurality of positions for a second puncture bit, wherein each second block error rate may be based on the second noise variance.

In some aspects, the generation of the puncture pattern may include determining a first noise variance of a first signal-to-noise ratio, determining a first subset of the bit error probabilities based on the first noise variance, generating a first preliminary puncture pattern based on the first subset of the bit error probabilities, determining a second noise variance of a second signal-to-noise ratio that is different from the first signal-to-noise ratio, determining a second subset of the bit error probabilities based on the second noise variance, and generating a second preliminary puncture pattern based on the first preliminary puncture pattern and the second subset of the bit error probabilities. In some aspects, the process 2100 may further include determining the first signal-to-noise ratio by increasing a preliminary first signal-to-noise ratio until a first block error rate for the first preliminary puncture pattern is less than or equal to a target block error rate, and determining the second signal-to-noise ratio by increasing a preliminary second signal-to-noise ratio until a second block error rate for the second preliminary puncture pattern is less than or equal to the target block error rate. In some aspects, the determination of each bit error probability may be based on a Gaussian approximation algorithm. In some aspects, the determination of each bit error probability may be based on a density evolution algorithm.

In some aspects, the generation of the puncture pattern may include generating a plurality of preliminary puncture patterns, determining a plurality of block error rates based on the preliminary puncture patterns, identifying a preliminary puncture pattern of the preliminary puncture patterns as being associated with a lowest block error rate of the block error rates, and selecting the identified preliminary puncture pattern as a final puncture pattern.

In some aspects, the generation of the puncture pattern may include determining corresponding block error rates (BLERs) for a plurality of preliminary puncture patterns based on the bit error probabilities, identifying one of preliminary puncture patterns as having a lowest block error rate, and selecting the identified preliminary puncture pattern as a final puncture pattern.

In some implementations, the circuit/module for generating 2022 of FIG. 20 performs the operations of block 2104. In some implementations, the code for generating 2046 of FIG. 20 is executed to perform the operations of block 2104.

At block 2106, the apparatus punctures a portion of the plurality of bits according to the puncture pattern of block 2104 to generate a second block of data.

In some implementations, the circuit/module for puncturing 2024 of FIG. 20 performs the operations of block 2106. In some implementations, the code for puncturing 2048 of FIG. 20 is executed to perform the operations of block 2106.

At block 2108, the apparatus transmits first information including the second block of data.

In some implementations, the circuit/module for outputting 2026 of FIG. 20 performs the operations of block 2108. In some implementations, the code for outputting 2050 of FIG. 20 is executed to perform the operations of block 2108.

At block 2110, the apparatus determines that another transmission is needed. For example, the apparatus may receive a NAK from another apparatus that received the first transmission.

In some implementations, the circuit/module for determining that another transmission is needed 2028 of FIG. 20 performs the operations of block 2110. In some implementations, the code for determining that another transmission is needed 2052 of FIG. 20 is executed to perform the operations of block 2110.

At block 2112, the apparatus transmits second information as a result of the determination of block 2106. In some aspects, the second information may include the portion of the plurality of bits from block 2106.

In some implementations, the circuit/module for outputting 2026 of FIG. 20 performs the operations of block 2112. In some implementations, the code for outputting 2050 of FIG. 20 is executed to perform the operations of block 2112.

In some aspects, the process 2100 may further include selecting a first coding rate to meet a target error rate for the transmission of the second information. In this case, the first data may be encoded according to the first coding rate. In some aspects, the process 2100 may further include determining a signal-to-noise ratio (SNR) for a channel over a period to time. In this case, the first coding rate may be selected based on the SNR. In some aspects, the process 2100 may further include selecting a second coding rate to meet a target error rate for the transmission of the first information. In this case, the first information may be transmitted according to the second coding rate.

In some aspects, the second information may further include a portion of the encoded data. In some aspects, the repetition information may include at least a portion of the encoded parity information. In some aspects, the process 2100 may further include comparing a first coding rate for the transmission of the first information to a second coding rate for the transmission of the second information, and determining, based on the comparison, whether to transmit the encoded data in the second information. In some aspects, the process 2100 may further include determining a quantity of bits for the encoded data based on a coding rate for the transmission of the second information.

In some aspects, the process 2100 may include any combination of the above features.

Second Example Process

Figure 22:
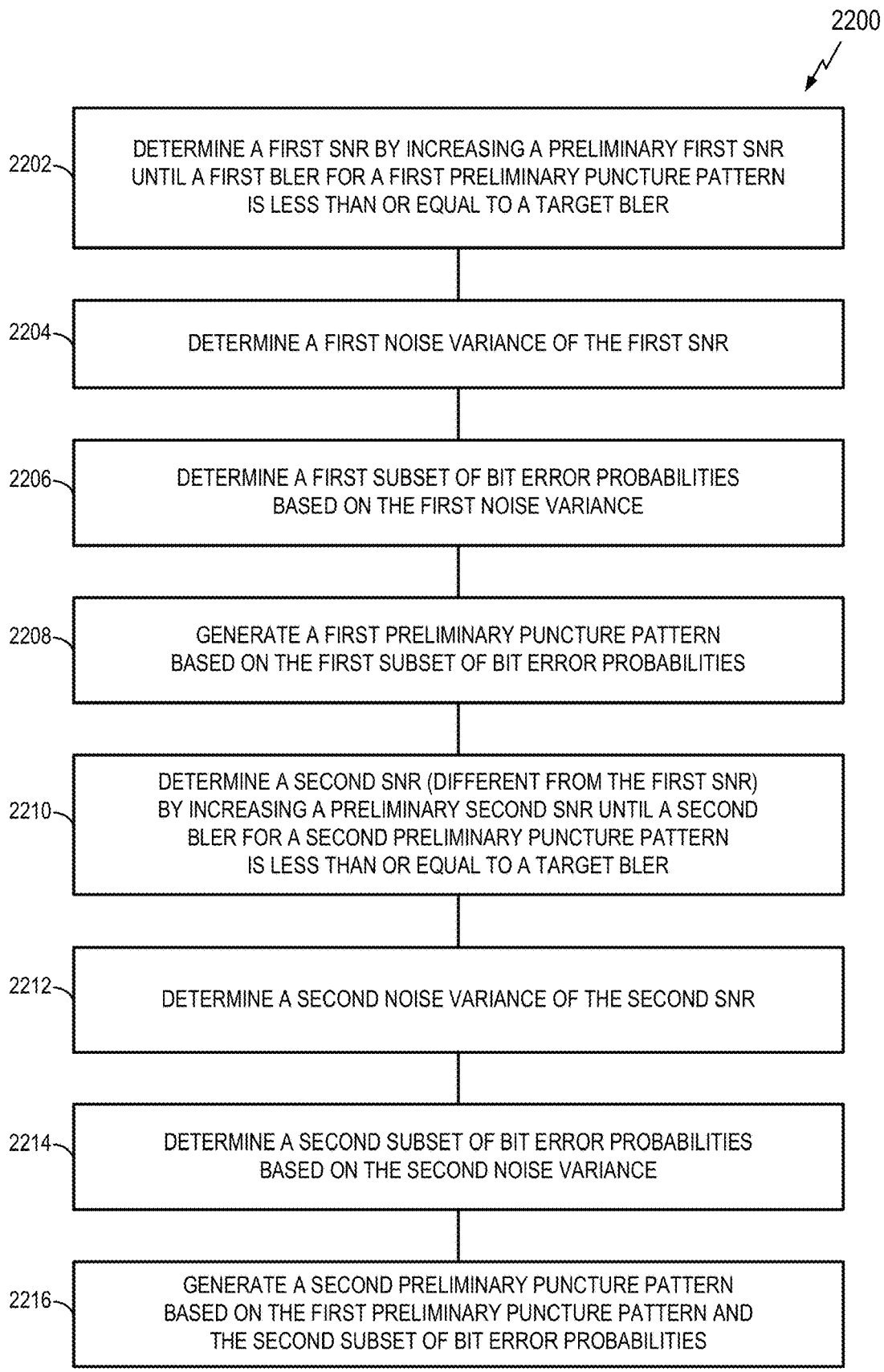
FIG. 22 is a flowchart illustrating an example of aspects of generating a puncture pattern in accordance with some aspects of the disclosure.

FIG. 22 illustrates a process 2200 for communication in accordance with some aspects of the disclosure. One or more aspects of the process 2200 may be used in conjunction with (e.g., in addition to or as part of) the process 2100 of FIG. 21. For example, the process 2200 may correspond, at least in some aspects, to block 2104 of FIG. 21. The process 2200 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2200 may be implemented by any suitable apparatus capable of supporting communication-related operations.

At block 2202, an apparatus (e.g., a device that includes an encoder) determines a first signal-to-noise ratio by increasing a preliminary first signal-to-noise ratio until a first block error rate for a first preliminary puncture pattern is less than or equal to a target block error rate.

In some implementations, the circuit/module for determining an SNR 2030 of FIG. 20 performs the operations of block 2202. In some implementations, the code for determining an SNR 2054 of FIG. 20 is executed to perform the operations of block 2202.

At block 2204, the apparatus determines a first noise variance of the first signal-to-noise ratio.

In some implementations, the circuit/module for determining an SNR 2030 of FIG. 20 performs the operations of block 2204. In some implementations, the code for determining an SNR 2054 of FIG. 20 is executed to perform the operations of block 2204.

At block 2206, the apparatus determines a first subset of bit error probabilities (e.g., a subset of the bit error probabilities of block 2104 of FIG. 21) based on the first noise variance.

In some implementations, the circuit/module for determining bit error probabilities 2032 of FIG. 20 performs the operations of block 2206. In some implementations, the code for determining bit error probabilities 2056 of FIG. 20 is executed to perform the operations of block 2206.

At block 2208, the apparatus generates a first preliminary puncture pattern based on the first subset of bit error probabilities.

In some implementations, the circuit/module for generating 2022 of FIG. 20 performs the operations of block 2208. In some implementations, the code for generating 2046 of FIG. 20 is executed to perform the operations of block 2208.

At block 2210, the apparatus determines the second signal-to-noise ratio by increasing a preliminary second signal-to-noise ratio until a second block error rate for a second preliminary puncture pattern is less than or equal to a target block error rate. In some aspects, the second signal-to-noise ratio may be different from the first signal-to-noise ratio.

In some implementations, the circuit/module for determining an SNR 2030 of FIG. 20 performs the operations of block 2210. In some implementations, the code for determining an SNR 2054 of FIG. 20 is executed to perform the operations of block 2210.

At block 2212, the apparatus determines a second noise variance of the second signal-to-noise ratio.

In some implementations, the circuit/module for determining an SNR 2030 of FIG. 20 performs the operations of block 2212. In some implementations, the code for determining an SNR 2054 of FIG. 20 is executed to perform the operations of block 2212.

At block 2214, the apparatus determines a second subset of bit error probabilities (e.g., a subset of the bit error probabilities of block 2104 of FIG. 21) based on the second noise variance.

In some implementations, the circuit/module for determining bit error probabilities 2032 of FIG. 20 performs the operations of block 2214. In some implementations, the code for determining bit error probabilities 2056 of FIG. 20 is executed to perform the operations of block 2214.

At block 2216, the apparatus generates a second preliminary puncture pattern based on the first preliminary puncture pattern and the second subset of bit error probabilities.

In some implementations, the circuit/module for generating 2022 of FIG. 20 performs the operations of block 2216. In some implementations, the code for generating 2046 of FIG. 20 is executed to perform the operations of block 2216.

In some aspects, the process 2200 may include any combination of the above features.

Third Example Process

Figure 23:
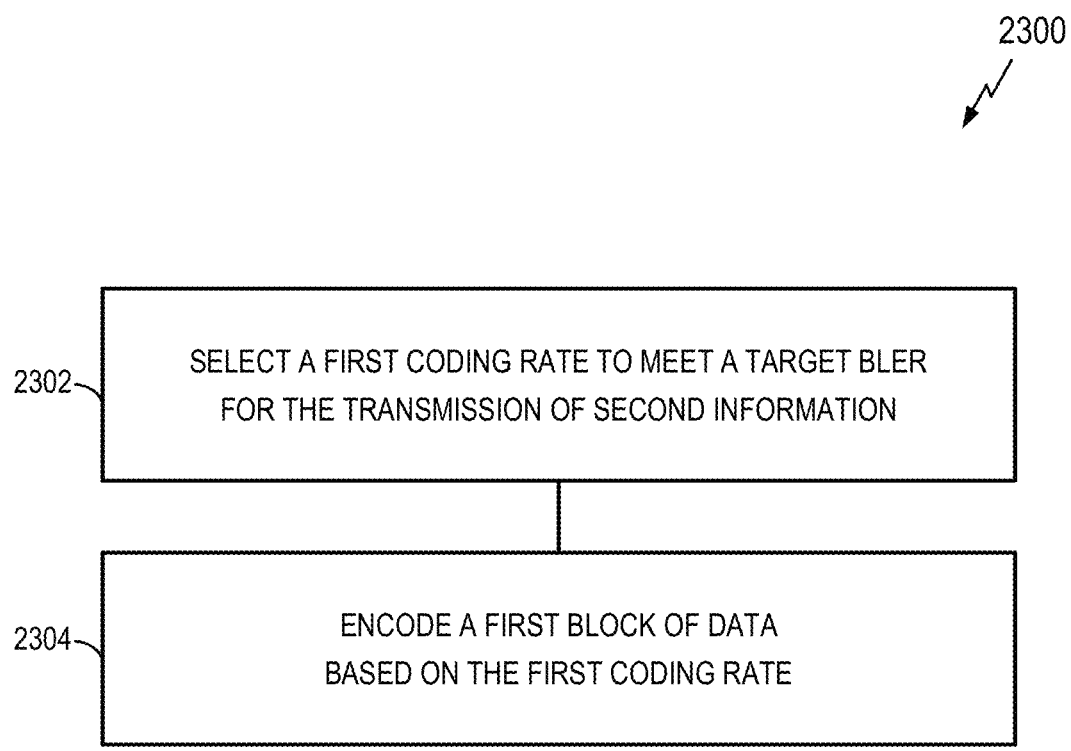
FIG. 23 is a flowchart illustrating an example of a process for encoding data at a rate that is based on a target block error rate for another transmission in accordance with some aspects of the disclosure.

FIG. 23 illustrates a process 2300 for communication in accordance with some aspects of the disclosure. One or more aspects of the process 2300 may be used in conjunction with (e.g., in addition to or as part of) the process 2100 of FIG. 21. For example, the process 2300 may correspond, at least in some aspects, to block 2102 of FIG. 21. The process 2300 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2300 may be implemented by any suitable apparatus capable of supporting communication-related operations.

At block 2302, an apparatus (e.g., a device that includes an encoder) selects a first coding rate to meet a target block error rate for the transmission of second information (e.g., the transmission of block 2112 of FIG. 21).

In some implementations, the circuit/module for selecting a coding rate 2034 of FIG. 20 performs the operations of block 2302. In some implementations, the code for selecting a coding rate 2058 of FIG. 20 is executed to perform the operations of block 2302.

At block 2304, the apparatus encodes a first block of data (e.g., the encoding of block 2102 of FIG. 21) according to the first coding rate.

In some implementations, the circuit/module for encoding 2020 of FIG. 20 performs the operations of block 2304. In some implementations, the code for encoding 2044 of FIG. 20 is executed to perform the operations of block 2304.

In some aspects, the process 2300 may include any combination of the above features.

Fourth Example Process

Figure 24:
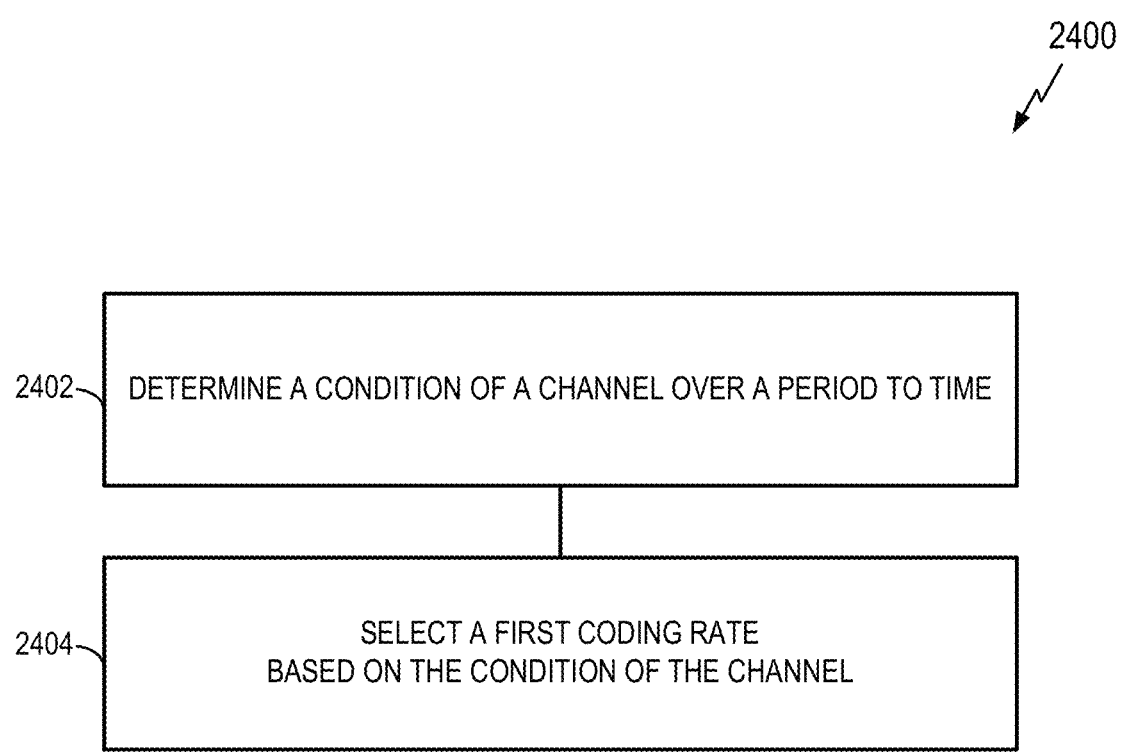
FIG. 24 is a flowchart illustrating an example of a process for selecting a coding rate based on a channel condition in accordance with some aspects of the disclosure.

FIG. 24 illustrates a process 2400 for communication in accordance with some aspects of the disclosure. One or more aspects of the process 2400 may be used in conjunction with (e.g., in addition to or as part of) the process 2100 of FIG. 21. For example, the process 2400 may correspond, at least in some aspects, to block 2102 of FIG. 21. The process 2400 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2400 may be implemented by any suitable apparatus capable of supporting communication-related operations.

At block 2402, an apparatus (e.g., a device that includes an encoder) determines a condition of a channel over a period of time.

In some implementations, the circuit/module for determining a condition of a channel 2036 of FIG. 20 performs the operations of block 2402. In some implementations, the code for determining a condition of a channel 2060 of FIG. 20 is executed to perform the operations of block 2402.

At block 2404, the apparatus selects a first coding rate based on the condition of the channel. For example, the first coding rate of block 2302 of FIG. 23 may be calculated based on the channel condition determined at block 2402. Thus, the selection of the first coding rate to meet the target block error rate may be based on the channel condition.

In some implementations, the circuit/module for selecting a coding rate 2034 of FIG. 20 performs the operations of block 2404. In some implementations, the code for selecting a coding rate 2058 of FIG. 20 is executed to perform the operations of block 2404.

In some aspects, the process 2400 may include any combination of the above features.

Fifth Example Process

Figure 25:
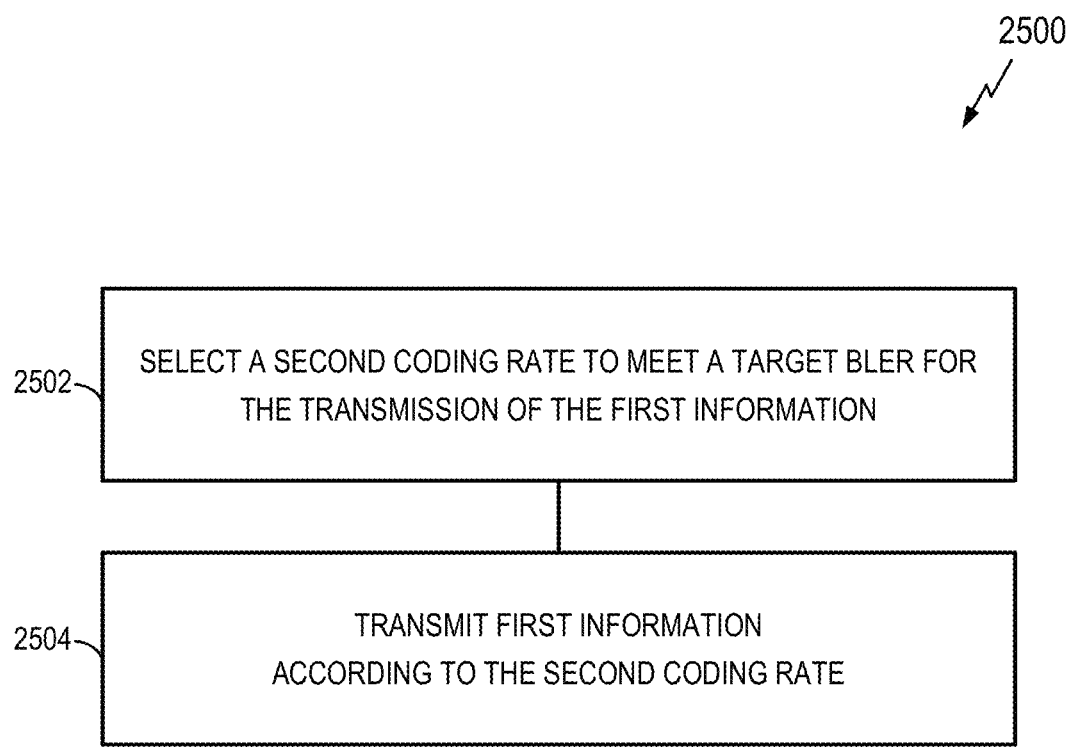
FIG. 25 is a flowchart illustrating an example of a process for transmitting data at a rate that is based on a target block error rate in accordance with some aspects of the disclosure.

FIG. 25 illustrates a process 2500 for communication in accordance with some aspects of the disclosure. One or more aspects of the process 2500 may be used in conjunction with (e.g., in addition to or as part of) the process 2100 of FIG. 21. For example, the process 2500 may correspond, at least in some aspects, to blocks 2106 and 2108 of FIG. 21. The process 2500 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2500 may be implemented by any suitable apparatus capable of supporting communication-related operations.

At block 2502, an apparatus (e.g., a device that includes an encoder) selects a second coding rate to meet a target error rate for the transmission of the first information. For example, this coding rate may be used to determine the puncturing to be applied to a mother code (e.g., the puncturing of block 2106 of FIG. 21). In some aspects, the target block error rate for the transmission of the first information may be different from the target block error rate for the transmission of the second information.

In some implementations, the circuit/module for selecting a coding rate 2034 of FIG. 20 performs the operations of block 2502. In some implementations, the code for selecting a coding rate 2058 of FIG. 20 is executed to perform the operations of block 2502.

At block 2504, the apparatus transmits first information according to the second coding rate. For example, this transmission may correspond to the transmission of block 2108 of FIG. 21.

In some implementations, the circuit/module for outputting 2026 of FIG. 20 performs the operations of block 2504. In some implementations, the code for outputting 2050 of FIG. 20 is executed to perform the operations of block 2504.

In some aspects, the process 2500 may include any combination of the above features.

Sixth Example Process

Figure 26:
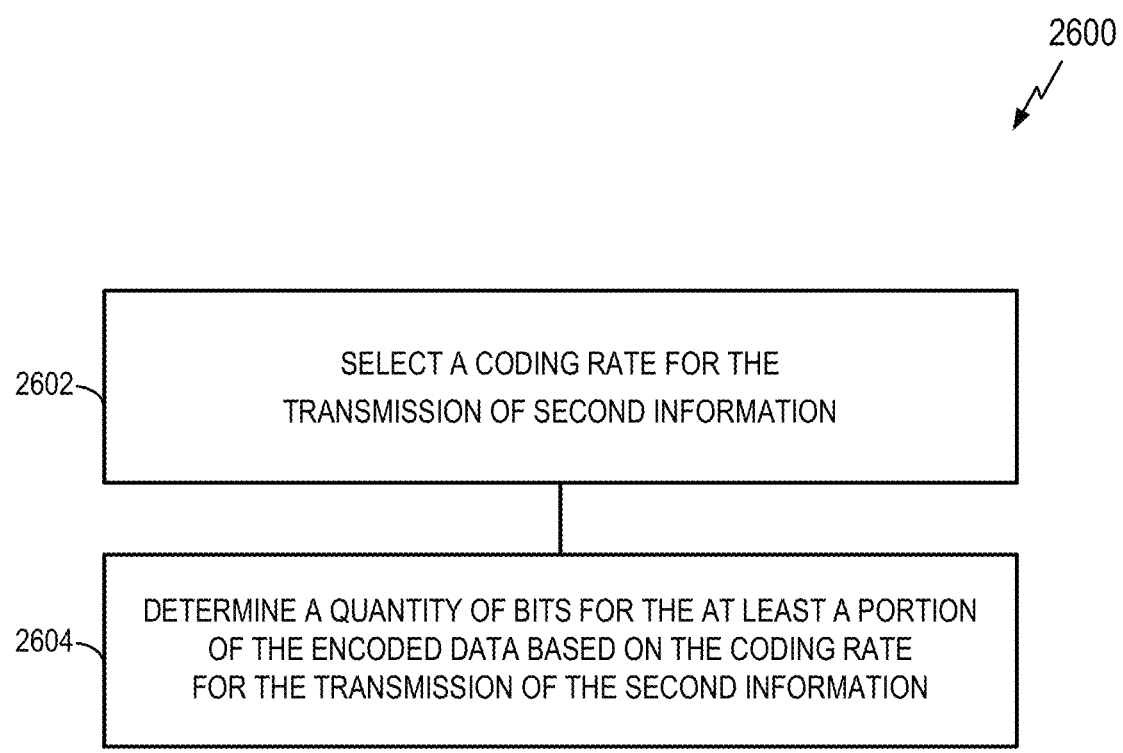
FIG. 26 is a flowchart illustrating an example of a process for determining a quantity of encoded bits to be included in a retransmission in accordance with some aspects of the disclosure.

FIG. 26 illustrates a process 2600 for communication in accordance with some aspects of the disclosure. One or more aspects of the process 2600 may be used in conjunction with (e.g., in addition to or as part of) the process 2100 of FIG. 21. For example, the process 2600 may correspond, at least in some aspects, to block 2112 of FIG. 21. The process 2600 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2600 may be implemented by any suitable apparatus capable of supporting communication-related operations.

At block 2602, an apparatus (e.g., a device that includes an encoder) selects a coding rate for the transmission of second information (e.g., the second information of block 2112 of FIG. 21). In some aspects, this selection may be based on channel quality indication (CQI) feedback. In some aspects, the second information may include at least a portion of the encoded data (e.g., at least a portion of the encoded data of block 2102 of FIG. 21).

In some implementations, the circuit/module for selecting a coding rate 2034 of FIG. 20 performs the operations of block 2602. In some implementations, the code for selecting a coding rate 2058 of FIG. 20 is executed to perform the operations of block 2602.

At block 2604, the apparatus determines a quantity of bits for the at least a portion of the encoded data. In some aspects, this determination may be based on the coding rate for the transmission of the second information. For example, additional encoded data bits may be included in the transmission of second information at block 2212 of FIG. 21 if the coding rate allows for the additional bits.

In some implementations, the circuit/module for determining a quantity of bits 2038 of FIG. 20 performs the operations of block 2604. In some implementations, the code for determining a quantity of bits 2062 of FIG. 20 is executed to perform the operations of block 2604.

In some aspects, the process 2600 may include any combination of the above features.

Seventh Example Process

Figure 27:
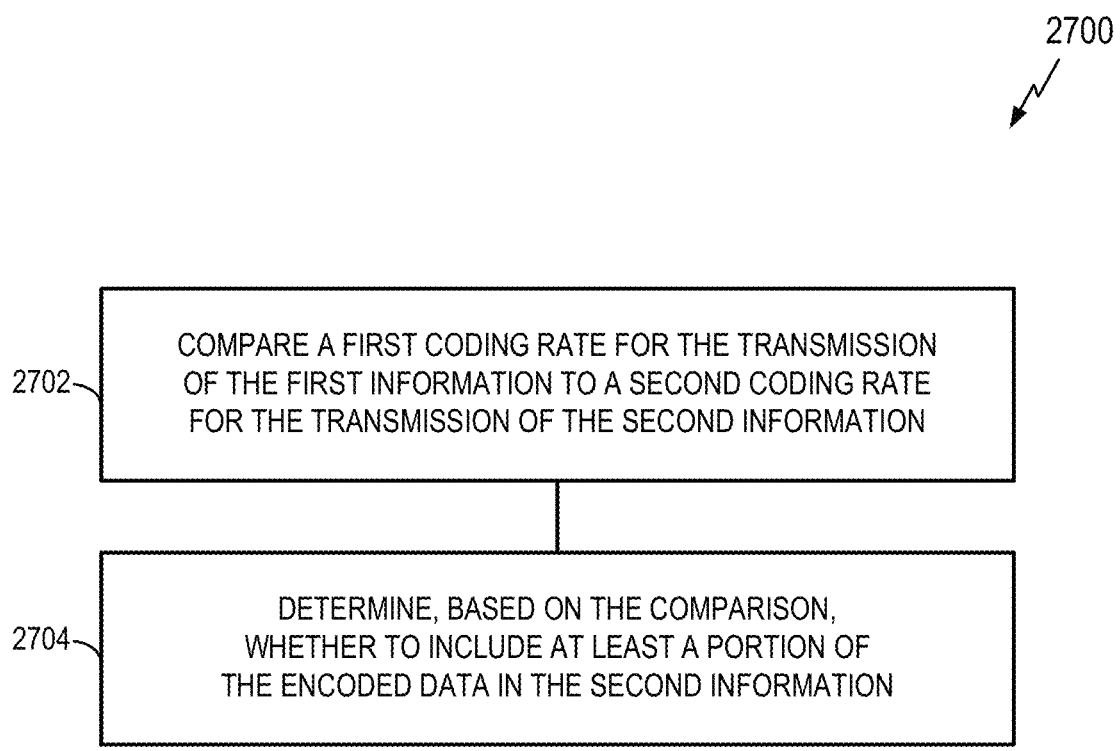
FIG. 27 is a flowchart illustrating an example of a process for determining whether to include encoded data in a retransmission in accordance with some aspects of the disclosure.

FIG. 27 illustrates a process 2700 for communication in accordance with some aspects of the disclosure. One or more aspects of the process 2700 may be used in conjunction with (e.g., in addition to or as part of) the process 2100 of FIG. 21. For example, the process 2700 may correspond, at least in some aspects, to block 2112 of FIG. 21. The process 2700 may take place within a processing circuit (e.g., the processing circuit 2010 of FIG. 20), which may be located in a UE, a TRP, a gNB, an access terminal, a base station, or some other suitable apparatus (e.g., that provides encoding). Of course, in various aspects within the scope of the disclosure, the process 2700 may be implemented by any suitable apparatus capable of supporting communication-related operations.

At block 2702, an apparatus (e.g., a device that includes an encoder) compares a first coding rate for the transmission of first information to a second coding rate for the transmission of second information. For example, the coding rate of block 2302 of FIG. 23 may be compared to second coding rate of block 2502 of FIG. 25.

In some implementations, the circuit/module for comparing 2040 of FIG. 20 performs the operations of block 2702. In some implementations, the code for comparing 2064 of FIG. 20 is executed to perform the operations of block 2702.

At block 2704, the apparatus determines, based on the comparison of block 2702, whether to include at least a portion of encoded data in the second information. For example, the apparatus may transmit at least a portion of the encoded data (e.g., the at least a portion from block 2604 of FIG. 26) if the second coding rate is less than the first coding rate.

In some implementations, the circuit/module for determining whether to include encoded data 2042 of FIG. 20 performs the operations of block 2704. In some implementations, the code for determining whether to include encoded data 2066 of FIG. 20 is executed to perform the operations of block 2704.

In some aspects, the process 2700 may include any combination of the above features.

Additional Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "one or more of a, b, or c" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication, comprising:
    selecting a first coding rate to meet a first target block error rate for a retransmission for a first transmission;
    encoding a first block of data according to the first coding rate to generate encoded data comprising a Polar codeword;
    puncturing the Polar codeword using a first puncture pattern to provide a punctured Polar codeword having fewer bits than the Polar codeword;
    generating a second puncture pattern based on bit error probabilities for bit positions associated with the punctured Polar codeword;
    puncturing a portion of the punctured Polar codeword according to the second puncture pattern to generate a second block of data that is a subset of the punctured Polar codeword having and has fewer bits than the punctured Polar codeword;
    selecting a second coding rate to meet a second target block error rate for the first transmission, the second target block error rate being different from the first target block error rate;
    transmitting the first transmission comprising the second block of data according to the second coding rate; and
    transmitting the retransmission comprising the punctured portion of the punctured Polar codeword.

2. The method of claim 1, wherein the generating the second puncture pattern comprises:
    generating at least three preliminary puncture patterns in succession from a first preliminary puncture pattern to a last preliminary puncture pattern, wherein a quantity of puncture bits in any one of the preliminary puncture patterns is different from a quantity of puncture bits in any other one of the preliminary puncture patterns; and
    selecting the last preliminary puncture pattern as a final puncture pattern.

3. The method of claim 2, wherein a quantity of puncture bits in the last preliminary puncture pattern is greater than a quantity of puncture bits in any other one of the preliminary puncture patterns.

4. The method of claim 2, wherein the generating the first preliminary puncture pattern comprises:
    calculating a plurality of block error rates based on a plurality of positions for a puncture bit;
    identifying a lowest block error rate of the block error rates; and
    identifying the first preliminary puncture pattern based on the lowest block error rate.

5. The method of claim 1, wherein the generating the second puncture pattern comprises:
    generating a first preliminary puncture pattern; and
    generating a second preliminary puncture pattern after the generating the first preliminary puncture pattern.

6. The method of claim 5, wherein the generating the first preliminary puncture pattern comprises:
    determining a first noise variance; and
    calculating a plurality of first block error rates based on a plurality of positions for a first puncture bit, wherein each first block error rate is based on the first noise variance.

7. The method of claim 6, wherein the generating the second preliminary puncture pattern comprises:
    determining a second noise variance that is different from the first noise variance; and
    calculating a plurality of second block error rates based on a plurality of positions for a second puncture bit, wherein each second block error rate is based on the second noise variance.

8. The method of claim 1, wherein the generating the second puncture pattern comprises:
    determining a first noise variance of a first signal-to-noise ratio;
    determining a first subset of the bit error probabilities based on the first noise variance;
    generating a first preliminary puncture pattern based on the first subset of the bit error probabilities;
    determining a second noise variance of a second signal-to-noise ratio that is different from the first signal-to-noise ratio;
    determining a second subset of the bit error probabilities based on the second noise variance; and
    generating a second preliminary puncture pattern based on the first preliminary puncture pattern and the second subset of the bit error probabilities.

9. The method of claim 8, further comprising:
    determining the first signal-to-noise ratio by increasing a preliminary first signal-to-noise ratio until a first block error rate for the first preliminary puncture pattern is less than or equal to a target block error rate; and
    determining the second signal-to-noise ratio by increasing a preliminary second signal-to-noise ratio until a second block error rate for the second preliminary puncture pattern is less than or equal to the target block error rate.

10. The method of claim 8, wherein the determining the first subset of the bit error probabilities and the determining the second subset of the bit error probabilities are based on a Gaussian approximation algorithm.

11. The method of claim 8, wherein the determining the first subset of the bit error probabilities and the determining the second subset of the bit error probabilities are based on a density evolution algorithm.

12. The method of claim 1, wherein the generating the second puncture pattern comprises:
    generating a plurality of preliminary puncture patterns;
    determining a plurality of block error rates based on the preliminary puncture patterns;
    identifying a preliminary puncture pattern of the preliminary puncture patterns as being associated with a lowest block error rate of the block error rates; and
    selecting the identified preliminary puncture pattern as a final puncture pattern.

13. The method of claim 1, wherein the encoding comprises Polar coding.

14. The method of claim 1, further comprising:
    determining a condition of a channel over a period to time, wherein the first coding rate is selected based on the condition of the channel.

15. The method of claim 1, wherein the retransmission further comprises at least a portion of the encoded data.

16. The method of claim 15, further comprising:
    determining a quantity of bits for the at least a portion of the encoded data based on the first coding rate.

17. The method of claim 1, further comprising:
    comparing the first coding rate to the second coding rate; and
    determining, based on the comparison, whether to include at least a portion of the encoded data in the retransmission.

18. An apparatus for communication comprising:
a memory; and
a processor coupled to the memory, the processor and the memory configured to:
- select a first coding rate to meet a first target block error rate for a retransmission for a first transmission;
- encode a first block of data according to the first coding rate to generate encoded data comprising a Polar codeword;
- puncture the Polar codeword using a first puncture pattern to provide a punctured Polar codeword having fewer bits than the Polar codeword;
- generate a second puncture pattern based on bit error probabilities for bit positions associated with the punctured Polar codeword;
- puncture a portion of the punctured Polar codeword according to the second puncture pattern to generate a second block of data that is a subset of the punctured Polar codeword having and has fewer bits than the punctured Polar codeword;
- select a second coding rate to meet a second target block error rate for the first transmission, the second target block error rate being different from the first target block error rate;
- transmit the first transmission comprising the second block of data according to the second coding rate; and
- transmit the retransmission comprising the punctured portion of the punctured Polar codeword.

19. The apparatus of claim 18, wherein the generation of the second puncture pattern comprises:
- generation of a plurality of preliminary puncture patterns in succession from a first preliminary puncture pattern to a last preliminary puncture pattern, wherein a quantity of puncture bits in any one of the preliminary puncture patterns is different from a quantity of puncture bits in any other one of the preliminary puncture patterns; and
- selection of the last preliminary puncture pattern as a final puncture pattern.

20. The apparatus of claim 19, wherein the generation of the first preliminary puncture pattern comprises:
- calculation of a plurality of block error rates based on a plurality of positions for a puncture bit;
- identification of a lowest block error rate of the block error rates; and
- identification of the first preliminary puncture pattern based on the lowest block error rate.

21. The apparatus of claim 18, wherein the generation of the second puncture pattern comprises:
- generation of a first preliminary puncture pattern; and
- generation of a second preliminary puncture pattern after the generation of the first preliminary puncture pattern.

22. The apparatus of claim 21, wherein:
the generation of the first preliminary puncture pattern comprises: determining a first noise variance; and calculating a plurality of first block error rates based on a plurality of positions for a first puncture bit, wherein each first block error rate is based on the first noise variance; and
the generation of the second preliminary puncture pattern comprises:
determining a second noise variance that is different from the first noise variance; and
calculating a plurality of second block error rates based on a plurality of positions for a second puncture bit, wherein each second block error rate is based on the second noise variance.

23. An apparatus for communication comprising:
- means for selecting a first coding rate to meet a first target block error rate for a retransmission for a first transmission;
- means for encoding a first block of data according to the first coding rate to generate encoded data comprising a Polar codeword;
- means for puncturing the Polar codeword using a first puncture pattern to provide a punctured Polar codeword having fewer bits than the Polar codeword;
- means for generating a second puncture pattern based on bit error probabilities for bit positions associated with the punctured Polar codeword;
- means for puncturing a portion of the punctured Polar codeword according to the second puncture pattern to generate a second block of data that is a subset of the punctured Polar codeword and has fewer bits than the punctured Polar codeword;
- means for selecting a second coding rate to meet a second target block error rate for the first transmission, the second target block error rate being different from the first target block error rate; and
- means for transmitting the first transmission comprising the second block of data according to the second coding rate;
- wherein the means for transmitting is configured to transmit the retransmission comprising the punctured portion of the punctured Polar codeword.

24. The apparatus of claim 23, wherein:
the retransmission further comprises at least a portion of the encoded data; and
the apparatus further comprises means for determining a quantity of bits for the at least a portion of the encoded data based on a the first coding rate.

25. The apparatus of claim 23, further comprising:
- means for comparing the first coding rate to the second coding rate; and
- means for determining, based on the comparison, whether to include at least a portion of the encoded data in the retransmission.

26. A non-transitory computer-readable medium storing computer-executable code, including code to:
- select a first coding rate to meet a first target block error rate for a retransmission for a first transmission;
- encode a first block of data according to the first coding rate to generate encoded data comprising a Polar codeword;
- puncture the Polar codeword using a first puncture pattern to provide a punctured Polar codeword having fewer bits than the Polar codeword;
- generate a second puncture pattern based on bit error probabilities for bit positions associated with the punctured Polar codeword;
- puncture a portion of the punctured Polar codeword according to the second puncture pattern to generate a second block of data that is a subset of the punctured Polar codeword having and has fewer bits than the punctured Polar codeword;
- select a second coding rate to meet a second target block error rate for the first transmission, the second target block error rate being different from the first target block error rate;

transmit the first transmission comprising the second block of data according to the second coding rate; and
transmit the retransmission comprising the punctured portion of the punctured Polar codeword.

* * * * *